(12) United States Patent
Takisawa et al.

(10) Patent No.: US 6,383,890 B2
(45) Date of Patent: *May 7, 2002

(54) WAFER BONDING METHOD, APPARATUS AND VACUUM CHUCK

(75) Inventors: Toru Takisawa; Takao Yonehara, both of Atsugi; Kenji Yamagata, Sagamihara, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/211,875

(22) Filed: Dec. 15, 1998

(30) Foreign Application Priority Data

Dec. 26, 1997 (JP) .............................................. 9-361010
Dec. 26, 1997 (JP) .............................................. 9-361011

(51) Int. Cl.[7] .......................... H01L 21/30; H01L 21/46; B25B 11/00; B30B 15/06

(52) U.S. Cl. .......................... 438/455; 269/21; 100/295; 438/458

(58) Field of Search .................................. 438/758, 455, 438/800, 458, 459; 156/538, 598, 539, 556, 580, 581; 100/295, 42, 35, 211, 214, 218, 264, 299, 219; 269/21

(56) References Cited

U.S. PATENT DOCUMENTS

| | | |
|---|---|---|
| 3,720,555 A | 3/1973 | Ceppi |
| 3,842,567 A | 10/1974 | Zwart et al. |
| 4,370,194 A | 1/1983 | Shaver et al. |

(List continued on next page.)

FOREIGN PATENT DOCUMENTS

| | | | |
|---|---|---|---|
| EP | 0 134 438 A2 | 3/1985 | .......... H05K/13/00 |
| EP | 0134438 A2 * | 3/1985 | |
| EP | 0 256 150 A1 | 2/1988 | |

(List continued on next page.)

OTHER PUBLICATIONS

Singapore Search Report Dated Aug. 27, 1999.
Patent Abstracts of Japan, Application No. 09 137 217, Publication No. 10–335437A, dated Dec. 18, 1998.

(List continued on next page.)

*Primary Examiner*—Tuan H. Nguyen
*Assistant Examiner*—Evan Pert
(74) *Attorney, Agent, or Firm*—Morgan & Finnegan, L.L.P.

(57) ABSTRACT

Two wafers are properly brought into contact with each other. The first wafer is supported by a wafer support table (3) having an annular peripheral portion (3d). The substrate support table (3) is in contact with only the peripheral portion (3d) of the first wafer. While the second wafer opposing the first wafer is supported, the lower surface of the second wafer is pressed near its central portion, so the first and second wafers come into contact with each other outward from the central portion. The central portion (3c) of the wafer support table (3) is not in contact with the first wafer. Even when particles adhere to the central portion, unevenness on the supported first wafer can be prevented. Therefore, no gas is left between the wafers. This invention also provides a wafer support table formed by fabricating a silicon wafer. A commercially available silicon wafer is fabricated by lithography to prepare a wafer support table (31). The wafer support table (31) has sealing portions (31a, 31b) and deflection prevention portions (31c). The wafer to be supported is chucked by reducing the pressure between the sealing portions (31a, 31b). The wafer to be supported is in contact only with the sealing portions (31a, 31b) and the deflection prevention portions (31c)

50 Claims, 40 Drawing Sheets

U.S. PATENT DOCUMENTS

| | | | |
|---|---|---|---|
| 4,457,662 A | 7/1984 | Ireland et al. | |
| 4,506,184 A | 3/1985 | Siddall | 310/328 |
| 4,551,192 A | 11/1985 | Di Milia et al. | 156/345 |
| 4,686,877 A | 8/1987 | Jaritz et al. | |
| 4,707,012 A * | 11/1987 | Takagi | |
| 4,724,023 A | 2/1988 | Marriott | |
| 5,191,218 A * | 3/1993 | Mori et al. | |
| 5,213,451 A | 5/1993 | Frank et al. | |
| 5,273,553 A | 12/1993 | Hoshi et al. | |
| 5,427,973 A | 6/1995 | Satoh et al. | |
| 5,447,596 A | 9/1995 | Hayase | |
| 5,478,782 A * | 12/1995 | Satoh et al. | |
| 5,494,546 A | 2/1996 | Horvath | |
| 5,534,073 A | 7/1996 | Kinoshita et al. | |
| 5,564,682 A | 10/1996 | Tsuji | 269/21 |
| 5,707,498 A | 1/1998 | Ngan | |
| 5,769,991 A * | 6/1998 | Miyazawa et al. | 156/153 |
| 5,783,022 A | 7/1998 | Cha et al. | |
| 5,994,207 A | 11/1999 | Henley et al. | |
| 6,032,715 A * | 3/2000 | Ohkubo et al. | 156/538 |

FOREIGN PATENT DOCUMENTS

| | | | |
|---|---|---|---|
| EP | 0 2560150 | 2/1988 | |
| EP | A 0256150 | 4/1990 | |
| EP | 0 383 391 A1 | 8/1990 | |
| EP | 0 539 896 A1 | 5/1993 | H01L/21/00 |
| EP | 0 595 071 A1 | 5/1994 | H01L/21/00 |
| EP | 0 767 486 A2 | 4/1997 | |
| EP | 0 793 263 A2 | 9/1997 | |
| EP | 0 797 258 A2 | 9/1997 | |
| EP | 0 822 589 A1 | 2/1998 | |
| EP | 0 867 917 A2 | 3/1998 | |
| EP | 0 843 345 A2 | 5/1998 | |
| EP | 0 886 300 A2 | 12/1998 | |
| EP | 0 899 778 A2 | 3/1999 | |
| GB | 2 149 697 A | 6/1985 | B25B/11/00 |
| JP | A 1-135439 | 5/1989 | |
| JP | A 5-021338 | 1/1993 | |
| JP | 5-90393 A * | 4/1993 | |
| JP | A 7-302889 | 11/1995 | |
| JP | A 9-129557 | 5/1997 | H01L/21/205 |
| JP | 10-50810 A * | 2/1998 | |
| WO | WO 98/52216 | 11/1998 | |

OTHER PUBLICATIONS

Patent Abstracts of Japan, Application No. 09 088 543, Publication No. 10–050810A, dated Feb. 20, 1998.
JP 7122624, Abstract Only No Date.
European Seacr Report for application number EP 98 31 0414, dated Dec. 19, 2001.
Singapore Supplemental Search Report dated Jan. 6, 2000.
JP 09148407A, Jun. 6, 1997, Abstract.
Korean Office Action dated Sep. 21, 2000 corresponding to Korean Patent Application No. 1998–58983.
Partial European Search Report dated May 18, 2001 corresponding European Patent Application EP 98 31 0414/.
"History of Water jet Machining Development", Journal of the Water Jet Technology, Society of Japan, 1–1, 1994.
Abstract relating to JPA 1–135439 No Date.
Abstract relating to JPA 5–021338 No Date.
Abstract relating to JPA 7–302889 No Date.
U. S. Patent Application Serial No. 09/047,327 No Date.
European Search Report Application No. 99302393.6 dated Aug. 3, 2001.
Patent Abstracts of Japan, published Jun. 24, 1997, No. 09167724, "Wafer Debonder and Wafer Debonding Method Using It".

* cited by examiner

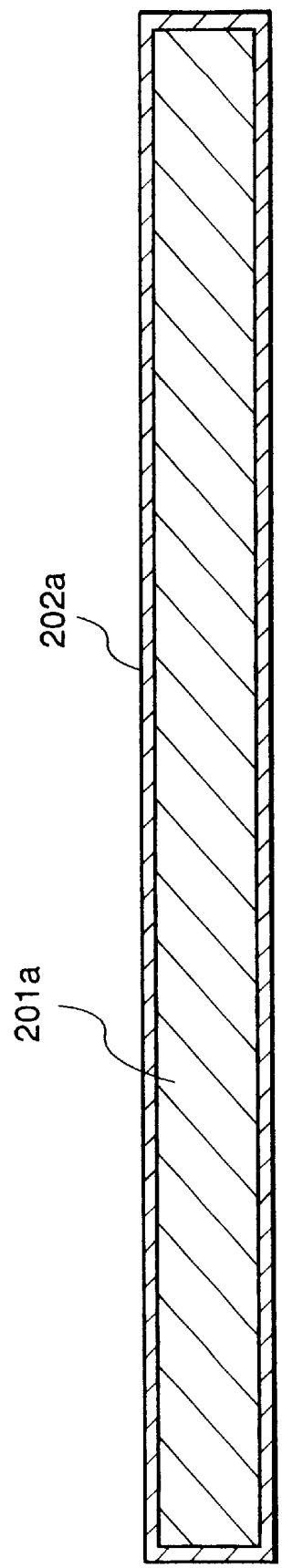

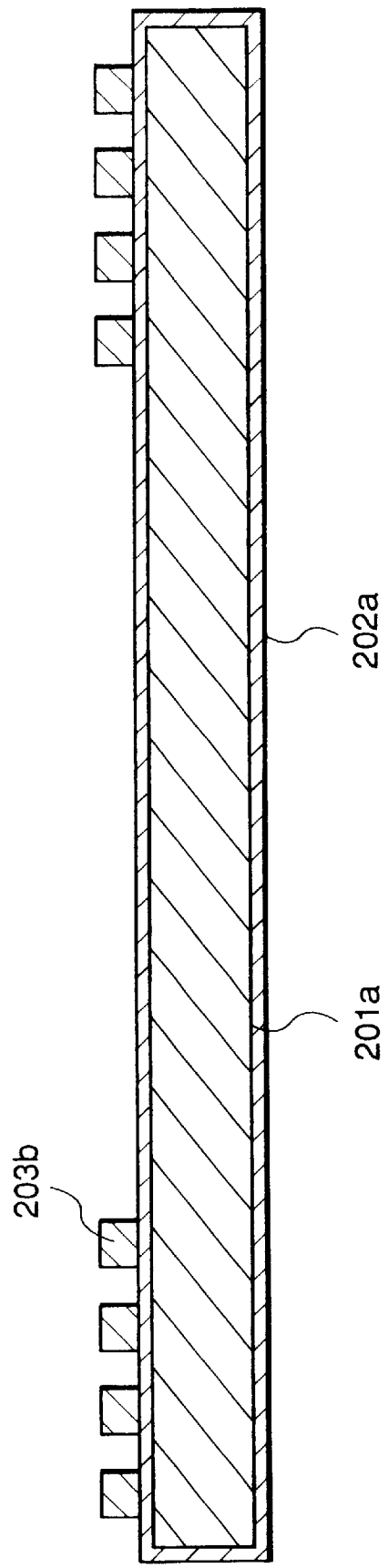

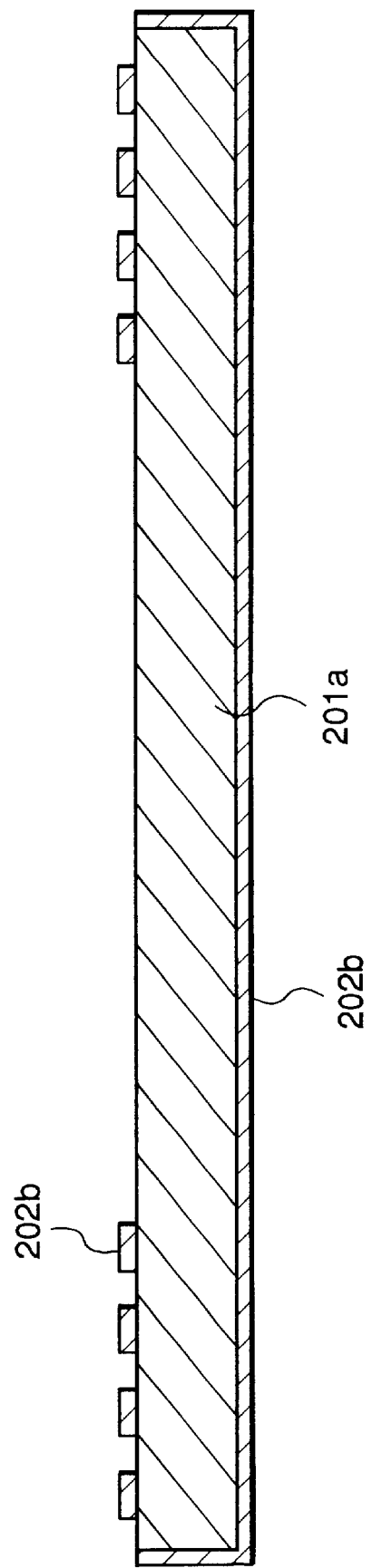

WAFER BONDING METHOD, APPARATUS AND VACUUM CHUCK

BACKGROUND OF THE INVENTION

1. Field of the Invention

The present invention relates to a substrate processing apparatus for overlaying and contacting two substrates with each other, a substrate support apparatus, and a substrate processing method, and a substrate manufacturing method using the apparatus or method.

The present invention also relates to a substrate support table consisting of a silicon material, a substrate processing apparatus including the substrate support table, methods of manufacturing and handling the substrate support table, and a substrate processing method.

2. Description of the Related Art

There is a method of bringing two wafers (substrates) into contact and bonding them by anode bonding, pressing, or heat treatment. This method is suitable to manufacture a wafer having, e.g., an SOI structure.

FIGS. 14A and 14B are schematic views showing the step of bonding wafers. In this bonding step, first, a first wafer 1 with its bonding surface facing up is set on a wafer support jig 201, and a second wafer 2 with its bonding surface facing down is softly placed on the first wafer 1, as shown in FIG. 14A. At this time, the upper wafer 2 floats on the gas (e.g., air or an inert gas) between the wafers, as shown in FIG. 14A.

As shown in FIG. 14B, when a press pin 202 presses the upper wafer 2 near its central portion before the gas between the wafers 1 and 2 is completely removed, the air at the central portion of the wafers moves to the periphery. The wafers 1 and 2 come into contact with each other at the central portion first. As the gas between the wafers gradually moves outward, the contact area expands, and finally, the entire wafers come into contact with each other.

Although the above method is applicable to bring two wafers into contact by simple operation, it has the following problems.

One of the problems is associated with wafer contamination due to alignment of two wafers. Since the upper wafer 2 floats on the gas between the wafers, friction in moving the upper wafer 2 in the horizontal plane is very small. The upper wafer 2 slides even when the jig 201 slightly tilts. Therefore, to properly align the two wafers 1 and 2, a means for limiting movement of the wafer 2 in the horizontal plane is required.

The jig 201 shown in FIGS. 14A and 14B has a recessed portion conforming to the shape of the wafers 1 and 2. The wafers 1 and 2 are aligned while being limited in their movement in the horizontal direction by the side walls of the recessed portion.

FIG. 15 is a view showing another jig for overlaying the wafers 1 and 2 while aligning them. A jig 205 has a plurality of alignment pins 204 and a press pin 203. The wafers 1 and 2 are pressed against the plurality of alignment pins 204 by the press pin 203, thereby limiting movement of the wafers 1 and 2 in the horizontal plane.

The method of overlaying two wafers using the jig shown in FIGS. 14A and 14B or FIG. 15 has factors that generate particles, inflict damage to the peripheral portions of the wafers, or lower the yield because the peripheral portions of the wafers are in contact with the jig.

As another problem, no constant condition can be obtained in pressing the wafers. More specifically, the time after the two wafers are overlaid until they are pressed by the press pin is not constant, and the gap between the wafers in pressing them by the press pin is not constant. Therefore, the quality of the wafer obtained by bringing two wafers into contact can be lowered by the resulting lack of uniformity. In addition, the gas between the wafers sometimes escapes before the wafers are pressed by the press pin. In this case, since the wafers cannot be brought into contact while gradually removing the gas outward from the central portion, some gas may remain entrapped between the wafers.

As an apparatus for supporting a substrate to be processed in the manufacture of a semiconductor device, a substrate support apparatus for supporting a substrate by vacuum chucking is used. As a substrate support table, i.e., a unit of the substrate support apparatus, normally, a plate consisting of a metal or ceramic material with high rigidity and having a chuck groove is used.

However, the conventional substrate support table is expensive in general, and a demand for a more inexpensive substrate support table has arisen.

SUMMARY OF THE INVENTION

The present invention has been made in consideration of the above problems, and has as its object to increase the quality of a substrate obtained by bringing two substrates into contact with each other.

According to the present invention, there is provided a substrate processing apparatus for overlaying two substrates and bringing the substrates into contact with each other, characterized by comprising support means for supporting the first substrate; and pressing means for pressing the second substrate against the first substrate, the second substrate opposing the first substrate supported by the support means, wherein the support means has a support member contacting a peripheral portion of one surface of the first substrate to support the first substrate.

In the substrate processing apparatus, the support means preferably has chuck means for chucking the first substrate on the support member.

In the substrate processing apparatus, preferably, the chuck means has an annular groove on a surface of the support member, and the first substrate is chucked by the support member by reducing a pressure in the groove.

In the substrate processing apparatus, the support member preferably has an annular shape.

In the substrate processing apparatus, the support member preferably supports an outermost portion of one surface of the first substrate.

In the substrate processing apparatus, the pressing means preferably presses the second substrate substantially at a central portion thereof.

In the substrate processing apparatus, the support means preferably has, inside the support member, a deflection prevention member for preventing deflection of the first substrate.

In the substrate processing apparatus, the deflection prevention member preferably supports the first substrate substantially at a central portion thereof, thereby preventing deflection of the first substrate.

In the substrate processing apparatus, a portion where the support member is in contact with the first substrate and a portion where the deflection prevention member is in contact with the first substrate are preferably positioned substantially in the same plane.

Preferably, the substrate processing apparatus further comprises substrate manipulation means for canceling support of the second substrate after the second substrate is supported to oppose the first substrate supported by the support means, and the pressing means presses the second substrate in synchronism with cancel of support of the second substrate by the substrate manipulation means.

In the substrate processing apparatus, preferably, the support means substantially horizontally supports the first substrate, and the substrate manipulation means substantially horizontally supports the second substrate above the first substrate and then cancels support of the second substrate.

According to the present invention, there is also provided a substrate support apparatus for supporting one of two substrates to be overlaid and brought into contact with each other, characterized by comprising a support member contacting a peripheral portion of one surface of a substrate to support the substrate.

The substrate support apparatus preferably further comprises chuck means for chucking the substrate on the support member.

In the substrate support apparatus, preferably, the chuck means has an annular groove on a surface of the support member, and the substrate is chucked by the support member by reducing a pressure in the groove.

In the substrate support apparatus, the support member preferably has an annular shape.

The substrate support apparatus preferably further comprises, inside the support member, a deflection prevention member for preventing deflection of the substrate.

In the substrate support apparatus, the deflection prevention member preferably supports the substrate substantially at a central portion thereof, thereby preventing deflection of the substrate.

In the substrate support apparatus, a portion where the support member is in contact with the substrate and a portion where the deflection prevention member is in contact with the substrate are preferably positioned substantially in the same plane.

According to the present invention, there is also provided a substrate processing method of overlaying two substrates and bringing the substrates into contact with each other, characterized by comprising supporting a first substrate by a support member contacting a peripheral portion of one surface of the first substrate, and pressing a second substrate toward the first substrate, the second substrate opposing the first substrate, thereby bringing the first and second substrates into contact with each other.

In the substrate processing method, preferably, a support member having a chuck mechanism is used as the support member.

In the substrate processing method, preferably, an annular support member is used as the support member.

In the substrate processing method, the support member preferably supports an outermost portion of the first substrate.

In the substrate processing method, the second substrate is preferably pressed substantially at a central portion thereof.

In the substrate processing method, the step of pressing the second substrate preferably comprises bringing a deflection prevention member formed inside the support member into contact with the first substrate.

The above apparatus and method are suitable to manufacture a SOI substrate.

According to the present invention, there is provided a substrate processing method of overlaying two substrates and bringing the substrates into contact with each other, characterized by comprising the steps of transferring first and second substrates to any one of the above substrate processing apparatuses, overlaying the first and second substrates and bringing the substrates into contact with each other by the substrate processing apparatus, and receiving the substrates in contact with each other from the substrate processing apparatus.

According to the present invention, there is also provided a substrate processing method of overlaying two substrates and bringing the substrates into contact with each other, characterized by comprising the steps of causing any one of the above substrate support apparatuses to support a first substrate, opposing a second substrate to the first substrate supported by the substrate support apparatus, and overlaying the first substrate and the second substrate and bringing the substrates into contact with each other.

According to the present invention, there is also provided a method of manufacturing a substrate, characterized by comprising the steps of preparing first and second substrates, and bringing the first and second substrates into contact with each other by any one of the above substrate processing methods.

According to the present invention, there is also provided a method of manufacturing an SOI substrate, characterized by comprising the steps of preparing first and second substrates, bringing the first and second substrates into contact with each other by any one of the above substrate processing methods to prepare a substrate having a layer in which a single-crystalline Si layer and an insulating layer are stacked, and separating the substrates which are in contact with each other at a portion other than a contact interface to prepare one of the separated substrates as the substrate having the single-crystalline Si layer on the insulating layer.

The present invention has been made in consideration of the above problems, and has as its object to provide an inexpensive substrate support table.

According to the present invention, there is provided a substrate support table characterized by comprising a member consisting of a silicon material.

According to the present invention, there is also provided a substrate support table characterized by comprising a member formed from a silicon wafer.

The substrate support table preferably comprises a chuck portion for chucking a substrate to be supported.

In the substrate support table, the chuck portion is preferably formed by lithography.

In the substrate support table, the chuck portion is preferably formed by etching the silicon wafer.

In the substrate support table, the chuck portion is preferably formed by wet-etching the silicon wafer.

In the substrate support table, the chuck portion preferably includes sealing portions for vacuum-chucking the substrate and a suction hole for exhausting a gas in a space defined by the sealing portions.

In the substrate support table, preferably, the sealing portions are doubled along inside a periphery of the substrate to be supported, and the suction hole communicates with the space between the doubled sealing portions.

In the substrate support table, the sealing portions preferably project to have a bank shape at the periphery.

In the substrate support table, preferably, in chucking the substrate, only the sealing portions are brought into contact with the substrate.

The substrate support table preferably further comprises a deflection prevention portion for preventing the chucked substrate from deflecting.

In the substrate support table, the deflection prevention portion is preferably formed between the sealing portions.

In the substrate support table, preferably, in chucking the substrate, only the sealing portions and the deflection prevention portion are brought into contact with the substrate.

In the substrate support table, the surfaces of the sealing portions and the deflection prevention portion, which are in contact with the substrate to be supported, are preferably positioned substantially in the same plane.

In the substrate support table, the chuck portion is preferably located at a position where a peripheral portion of the substrate to be supported can be chucked.

In the substrate support table, preferably, a pin hole through which a load pin for vertically moving the substrate to be supported on the substrate support table is inserted extends through the main body.

The silicon wafer preferably complies with the SEMI standard or the JAIDA standard.

According to the present invention, there is provided a substrate processing apparatus for overlaying two substrates and bringing the substrates into contact with each other, characterized by comprising an attachment/detachment mechanism for attaching/detaching the substrate support table, and pressing means for pressing a second substrate toward a first substrate supported by the attached substrate support table, the second substrate opposing the first substrate.

In the substrate processing apparatus, the pressing means preferably presses the second substrate substantially at a central portion thereof.

Preferably, the substrate processing apparatus further comprises substrate manipulation means for canceling support of the second substrate after the second substrate is supported to oppose the first substrate supported by the substrate support table, and the pressing means presses the second substrate in synchronism with cancel of support of the second substrate by the substrate manipulation means.

In the substrate processing apparatus, preferably, the substrate support table substantially horizontally supports the first substrate, and the substrate manipulation means substantially horizontally supports the second substrate above the first substrate and then cancels support of the second substrate.

The above substrate support table and the substrate processing apparatus are suitable to manufacture, e.g. an SOI substrate.

According to the present invention there is provided a substrate processing method of overlaying two substrates and bringing the substrates into contact with each other, characterized by comprising the steps of causing any one of the above substrate support tables to support a first substrate, opposing a second substrate to the first substrate supported by the substrate support table, and overlaying the first substrate and the second substrate and bringing the substrates into contact with each other.

According to the present invention, there is also provided a substrate processing method of overlaying two substrates and bringing the substrates into contact with each other, characterized by comprising the steps of transferring first and second substrates to any one of the above substrate processing apparatuses, overlaying the first and second substrates and bringing the substrates into contact with each other by the substrate processing apparatus, and receiving the substrates in contact with each other from the substrate processing apparatus.

According to the present invention, there is also provided a method of manufacturing an SOI substrate, characterized by comprising the steps of preparing first and second substrates, bringing the first and second substrates into contact with each other by any one of the above substrate processing methods to prepare a substrate having a layer in which a single-crystalline Si layer and an insulating layer are stacked, and separating the substrates which are in contact with each other at a portion other than a contact interface to prepare one of the separated substrates as the substrate having the single-crystalline Si layer on the insulating layer.

According to the present invention, there is also provided a cleaning method characterized by comprising cleaning the substrate support table while accommodating the above substrate support table in a wafer cassette for storing a wafer for manufacturing a semiconductor device.

According to the present invention, there is also provided a method of handling the wafer processing apparatus, characterized by comprising the steps of detaching the substrate support table from the wafer processing apparatus, cleaning the substrate support table while accommodating the detached substrate support table in a wafer cassette for storing a wafer for manufacturing a semiconductor device, and attaching the cleaned substrate support table in the wafer processing apparatus.

According to the present invention, there is also provided a method of manufacturing a substrate support table, characterized by comprising the steps of forming an $SiO_2$ film to cover an entire silicon wafer, forming a first photoresist film on one surface of the $SiO_2$ film, patterning the first photoresist film to expose the $SiO_2$ film at a portion where sealing portions for vacuum chucking are to be formed, etching the $SiO_2$ film at the exposed portion to expose the silicon wafer, removing the remaining first photoresist film, etching the silicon wafer at the exposed portion to a predetermined depth, forming an $SiO_2$ film to cover the entire silicon wafer, forming a second photoresist film on the other surface of the $SiO_2$ film, patterning the second photoresist film to expose the $SiO_2$ film at a portion where a suction hole for vacuum chucking is to be formed, etching the $SiO_2$ film at the exposed portion to expose the silicon wafer, removing the remaining second photoresist film, etching the silicon wafer at the exposed portion to form the suction hole extending through the silicon wafer, and removing the remaining $SiO_2$ film.

According to the present invention, there is also provided a method of manufacturing a substrate support table, characterized by comprising the steps of forming a first film to cover an entire silicon wafer, forming a first photoresist film on one surface of the first film, patterning the first photoresist film to expose the first film at a portion where sealing portions for vacuum chucking are to be formed, etching the first film at the exposed portion to expose the silicon wafer, removing the remaining first photoresist film, etching the silicon wafer at the exposed portion to a predetermined depth, forming a second film to cover the entire silicon wafer, forming a second photoresist film on the other surface of the second film, patterning the second photoresist film to expose the second film at a portion where a suction hole for vacuum chucking is to be formed, etching the second film at the exposed portion to expose the silicon wafer, removing the remaining second photoresist film, etching the silicon wafer at the exposed portion to form the suction hole extending through the silicon wafer, and removing the remaining second film.

Further object, features and advantages of the present invention will become apparent from the following detailed description of embodiments of the present invention with reference to the accompanying drawings.

DETAILED DESCRIPTION OF THE PREFERRED EMBODIMENTS

Preferred embodiments of the present invention will be described below with reference to the accompanying drawings.

[First Embodiment]

Figure 1:
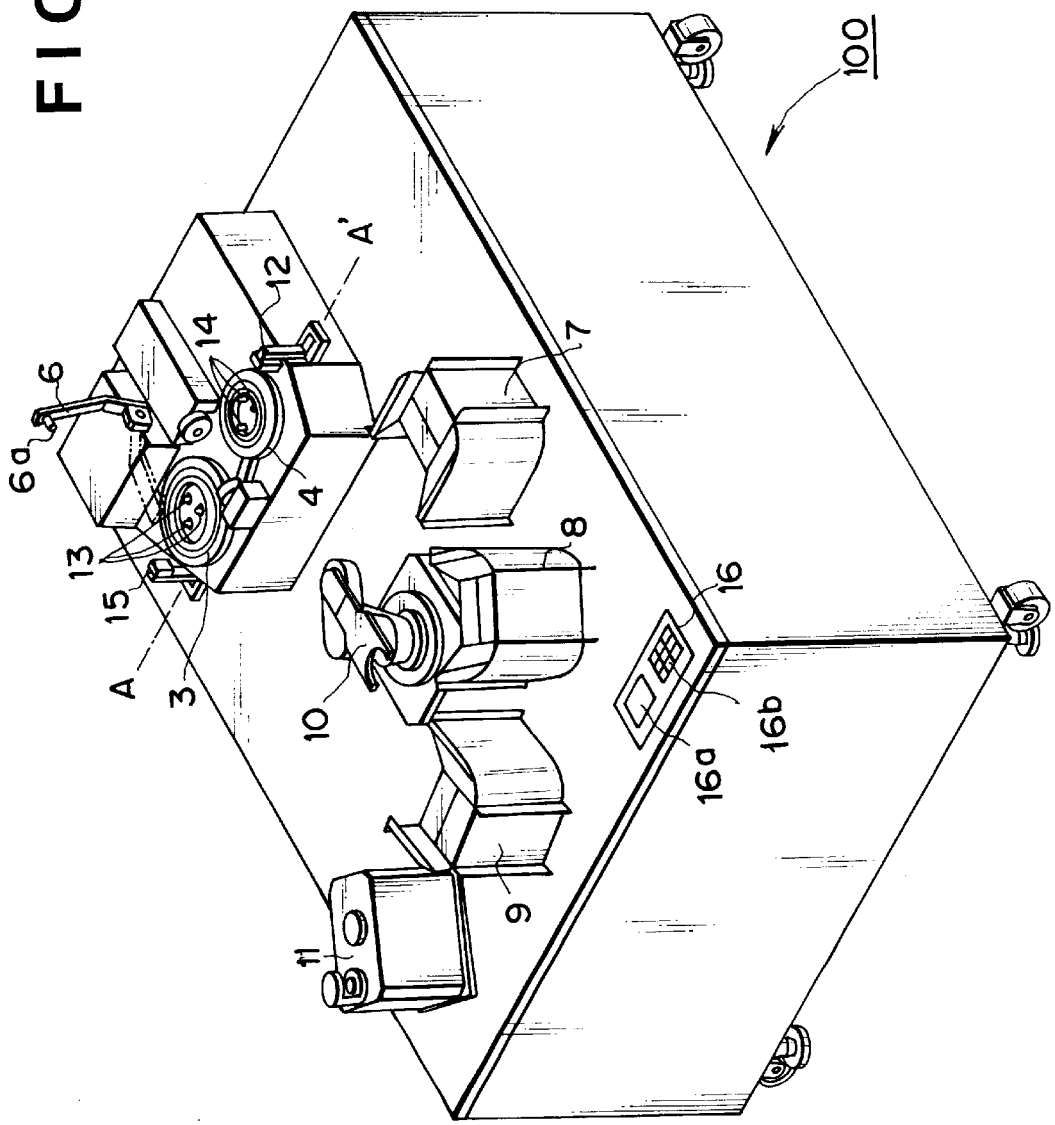
FIG. 1 is a perspective view schematically showing the overall arrangement of a wafer processing apparatus according to a preferred embodiment of the present invention.
Figure 2:
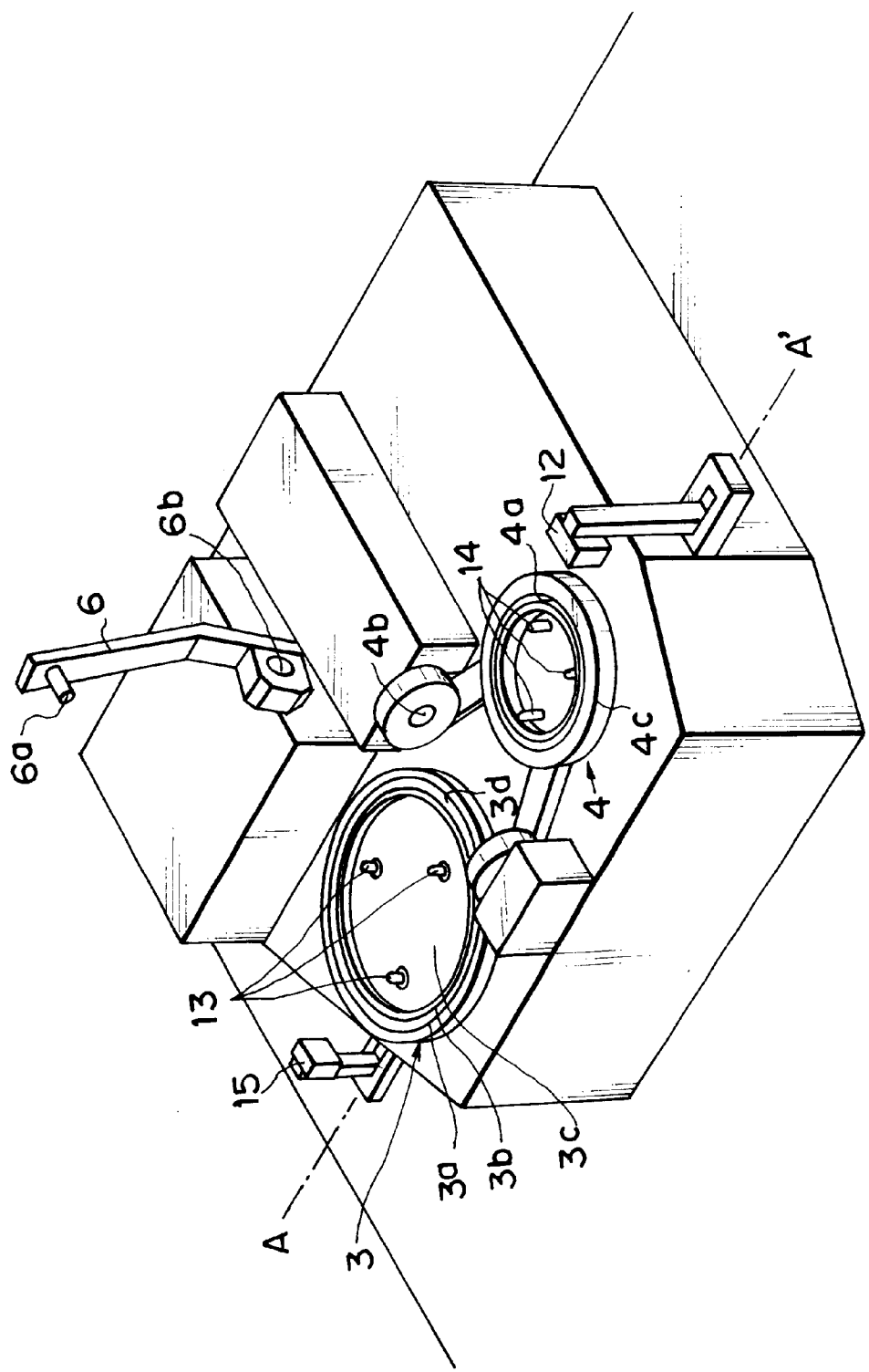
FIG. 2 is an enlarged view of part of FIG. 1.
Figure 3:
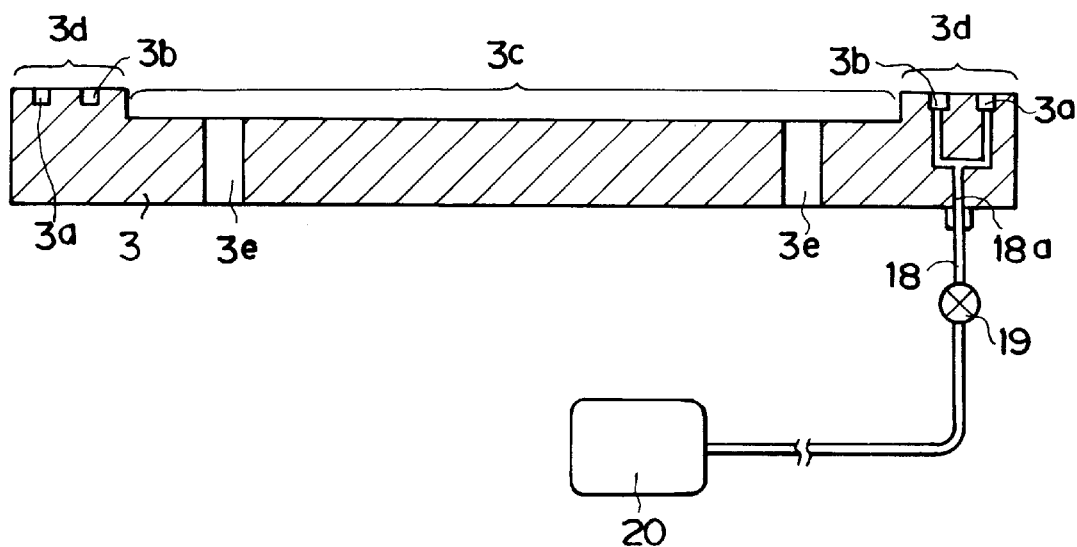
FIG. 3 is a sectional view showing the arrangement of a wafer support section of the wafer processing apparatus shown in FIGS. 1 and 2.
Figure 4:
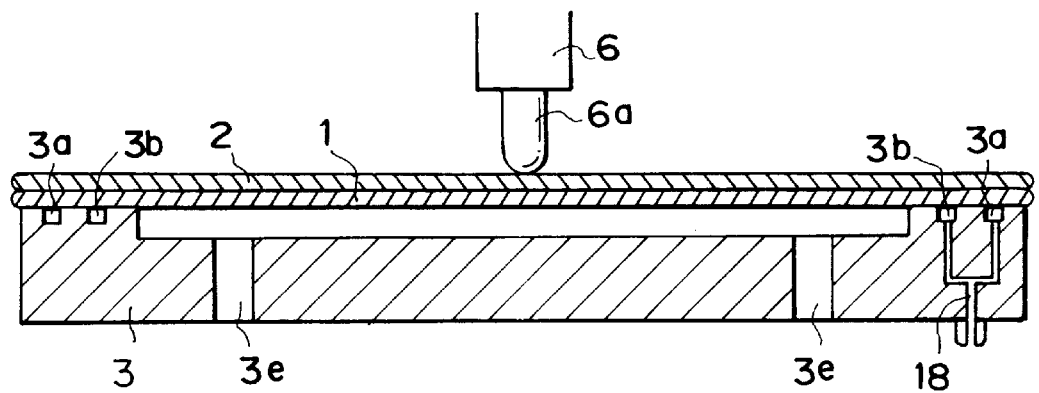
FIG. 4 is a view showing a state wherein two wafers are brought into contact on the wafer support section shown in FIG. 3.

FIG. 1 is a perspective view schematically showing the overall arrangement of a wafer processing apparatus according to the first embodiment. FIG. 2 is an enlarged view of part of FIG. 1. FIG. 3 is a sectional view showing the arrangement of a wafer support section of a wafer processing apparatus 100 shown in FIGS. 1 and 2. FIG. 4 is a view showing a state wherein two wafers are brought into contact on the wafer support section shown in FIG. 3. FIGS. 5 to 9 are sectional views showing the wafer processing apparatus 100 show in FIGS. 1 and 2 taken along a line A–A'. FIGS. 5 to 9 show the operation of bringing two wafers into contact.

The wafer processing apparatus 100 overlays two wafers and brings them into contact and is suitably used to practice a method of bonding two wafers to manufacture a wafer having, e.g., an SOI structure.

The wafer processing apparatus 100 has a wafer support table 3 for supporting a first wafer 1 (FIG. 4) from its lower surface, and a wafer moving mechanism 4 for chucking a second wafer 2 (FIG. 4) from its lower surface and making the second wafer 2 oppose almost parallel to the first wafer 1.

The wafer support table 3 preferably has a contact surface which comes into contact with only the peripheral portion (and more preferably with the outermost portion) of the lower surface of the first wafer 1. The contact surface is preferably annular. When the wafer support table 3 comes into contact with only the lower surface of the first wafer 1, the upper surface of the first wafer 1 can be prevented from being contaminated by particles, and additionally, damage to the first wafer 1 can also be prevented. Furthermore, when the wafer support table 3 comes into contact with only the peripheral portion or part of the lower surface of the first wafer 1, unevenness on the first wafer 1 supported on the wafer support table 3 due to particles which may adhere to the wafer support table 3 or the lower surface of the first wafer 1 can be prevented.

The wafer support table 3 preferably has a chuck mechanism for chucking the first wafer 1. In this embodiment, the wafer support table 3 has a vacuum chuck mechanism. However, another chuck mechanism such as an electrostatic chuck mechanism may be employed.

The wafer moving mechanism 4 preferably comes into contact with only the lower surface of the second wafer 2. In this embodiment, the wafer moving mechanism 4 has a groove 4a for vacuum-chucking the wafer. To chuck the second wafer 2, the pressure in the groove 4a is reduced. With the lower surface of the second wafer 2 chucked by a wafer chuck portion 4c, the wafer moving mechanism 4 pivots about a shaft 4b through about 180° to make the second wafer 2 oppose almost parallel to the first wafer 1. The shaft 4b is located near the middle position between the wafer support table 3 and the wafer chuck portion 4c.

The wafer processing apparatus 100 also has, as a mechanism for adjusting the gap between the two wafers 1 and 2 opposing each other, a displacement detection section 15 for measuring the thickness of the first wafer 1 mounted on the wafer support table 3, a displacement detection section for measuring the thickness of the second wafer 2 chucked by the wafer chuck portion 4c, and a Z-axis stage 5 (FIG. 5) for vertically moving the wafer support table 3 on the basis of the measurement results from the displacement detection sections 12 and 15 to adjust the gap between the wafers 1 and 2 to a set value.

The wafer processing apparatus 100 also has a press mechanism 6 for pressing the upper wafer 2 near its central portion while the two wafers 1 and 2 are supported to be opposite to each other. A press pin 6a of the press mechanism 6 pivots about a shaft 6b to be close to the lower surface of the upper wafer 2 after the two wafers 1 and 2 are supported to be opposite to each other. When the wafer chuck portion 4c of the wafer moving mechanism 4 cancels chucking of the upper wafer 2, the press mechanism 6 presses the upper wafer 2 by pressing the press pin 6a against the lower surface of the wafer 2. The two wafers 1 and 2 gradually come into contact with each other outward from the pressed portion, and accordingly, the gas between the wafers 1 and 2 is expelled outward. Consequently, no gas remains entrapped between the wafers 1 and 2.

The wafer 2 is preferably pressed by the press pin 6a almost simultaneously with cancel of chucking of the wafer 2 by the wafer chuck portion 4c. In this case, pressing can be started while maintaining the gap between the two wafers 1 and 2, which is adjusted to the set value. This can increase uniformity and the quality of the wafer obtained by bringing the two wafers into contact. In addition, gas entrapment between the wafers 1 and 2 can be more effectively prevented. Furthermore, shift of the wafers 1 and 2 can be prevented.

The press mechanism 6 incorporates a vibrator (e.g., a piezoelectric element) for vibrating the press pin 6a. By vibrating the press pin 6a which is pressing the wafer 2, the gas between the wafers 1 and 2 can be efficiently removed.

Pressing the wafer 2 by the press pin 6a may be controlled at another timing. For example, pressing may be performed at a predetermined timing before a predetermined amount of gas between the wafers 1 and 2 is removed after chucking of the wafer 2 is canceled, at a timing upon counting a predetermined time after chuck of the wafer 2 is canceled, or at a predetermined timing after chucking of the wafer 2 is canceled and before the distance between the wafers 1 and 2 becomes a predetermined distance or less due to the weight of the wafer 2.

The wafer processing apparatus 100 also has a wafer transfer robot 10 for setting the wafers 1 and 2 on the wafer support table 3 and the wafer chuck portion 4c, respectively, and receiving the wafers in contact with each other from the wafer support table 3, and a wafer alignment section 11.

In this wafer processing apparatus 100, before the start of wafer contact processing, wafer cassettes 7 and 8 storing wafers 1 and 2 which have not been processed yet, and a wafer cassette 9 for storing processed wafers are set at predetermined positions. In this embodiment, wafers 1 and 2 which have not been processed yet are stored in the wafer cassettes 7 and 8, respectively, while having the lower surfaces facing down.

When the start of wafer contact processing is instructed with an operation switch 16b on a control panel 16, the wafer transfer robot 10 chucks the lower surface of an unprocessed wafer 1 stored in the wafer cassette 7, and transfers the wafer 1 to the wafer alignment section 11. The wafer alignment section 11 detects the central position and direction (e.g., the orientation flat and notch position) of the transferred wafer 1 using a sensor and adjusts the central position and direction. The wafer alignment section 11 preferably comes into contact with only the lower surface of the wafer 1.

After this, the wafer transfer robot 10 receives the aligned wafer 1 and sets it at a predetermined position on load pins 13 which project from the wafer support table 3 through load pin holes 3e. After the wafer 1 is mounted on the load pins 13, the wafer support table 3 moves upward, so the wafer 1 is supported by the wafer support table 3. Since the wafer 1 has already been aligned by the wafer alignment section 11 and transferred to the wafer support table 3 while maintaining its positional relationship, the central position and direction of the wafer 1 need not be adjusted again on the wafer support table 3. However, alignment of the wafer 1 maybe performed on the wafer support table 3.

Next, the wafer transfer robot 10 extracts an unprocessed wafer 2 from the wafer cassette 8. With the same procedures as described above, the wafer alignment section 11 adjusts the central position and direction of the wafer 2, and then, the wafer 2 is set at a predetermined position on load pins 14 which project from the wafer chuck portion 4c of the wafer moving mechanism 4. After the wafer 2 is mounted on the load pins 14, the wafer chuck portion 4c pivots about the shaft 4b until the wafer chuck portion 4c contacts the lower surface of the wafer 2. The pressure in the groove 4a is reduced, so the wafer 2 is chucked by the wafer chuck portion 4c. As described above, since the wafer 2 has already been aligned by the wafer alignment section 11 and chucked by the wafer chuck portion 4c while maintaining its positional relationship, the central position and direction of the wafer 2 need not be adjusted again in chucking. In chucking the wafer 2, the load pins 14 may be retracted downward instead of pivoting the wafer chuck portion 4c.

While the wafers 1 and 2 are being supported by the wafer support table 3 and the wafer chuck portion 4c, respectively, the displacement detection sections 15 and 12 measure the thicknesses of the wafers 1 and 2. More specifically, the displacement detection sections 15 and 12 move sensors 15a and 12a close to the upper portions of the wafers 1 and 2, irradiate the wafers 1 and 2 with light, and measure the thicknesses of the wafers 1 and 2 on the basis of the reflected light, respectively.

When measurement of the thicknesses of the wafers 1 and 2 is ended, the wafer chuck portion 4c pivots about the shaft 4b through about 180° to make the wafer 2 oppose almost parallel to the wafer 1, as described above. After this, the gap between the wafers 1 and 2 is adjusted by the Z-axis stage 5, and the wafer 2 is pressed by the press pin 6a, thus completing contact processing.

When contact processing is ended, the wafer support table 3 is moved downward by the Z-axis stage 5, and the processed wafers are supported by the load pins 13. After this, the wafer transfer robot 10 receives the processed wafers and stores them in the wafer cassette 9.

By repeatedly executing the above procedure, a plurality of wafers stored in the wafer cassettes 7 and 8 can be continuously processed.

The arrangement of the wafer support table 3 will be described next. The wafer support table 3 has a circular central portion 3c and an annular peripheral portion 3d. Two chuck grooves 3a and 3b are formed in the chuck surface of the peripheral portion 3d (surface where the wafer 1 is chucked) to vacuum-chuck the wafer 1.

The chuck grooves 3a and 3b communicate with a suction hole 18a which is coupled to a pipe 18 having a valve 19 midway. A vacuum pump 20 is connected to one end of the pipe 18. Wafer chucking by the chuck grooves 3a and 3b can be controlled by opening or closing the valve 19.

When the wafer 2 is to be pressed by the press pin 6a, the valve 19 is opened to lower the pressure in the chuck grooves 3a and 3b, thereby chucking the wafer 1. When the wafer 1 is chucked by the chuck grooves 3a and 3b formed in the surface of the peripheral portion 3d with a flat surface, the first wafer 1 is corrected to be nearly flat.

In this state, the wafer 2 is pressed at its central portion, as shown in FIG. 4. First, the central portions of the two wafers 1 and 2 come into contact, and then, the contact portion gradually expands outward. At this time, the contact portion expands in all directions almost at a constant speed.

The operation of the wafer processing apparatus 100 in bringing two wafers into contact will be described next with reference to FIGS. 5 to 9.

Figure 5:
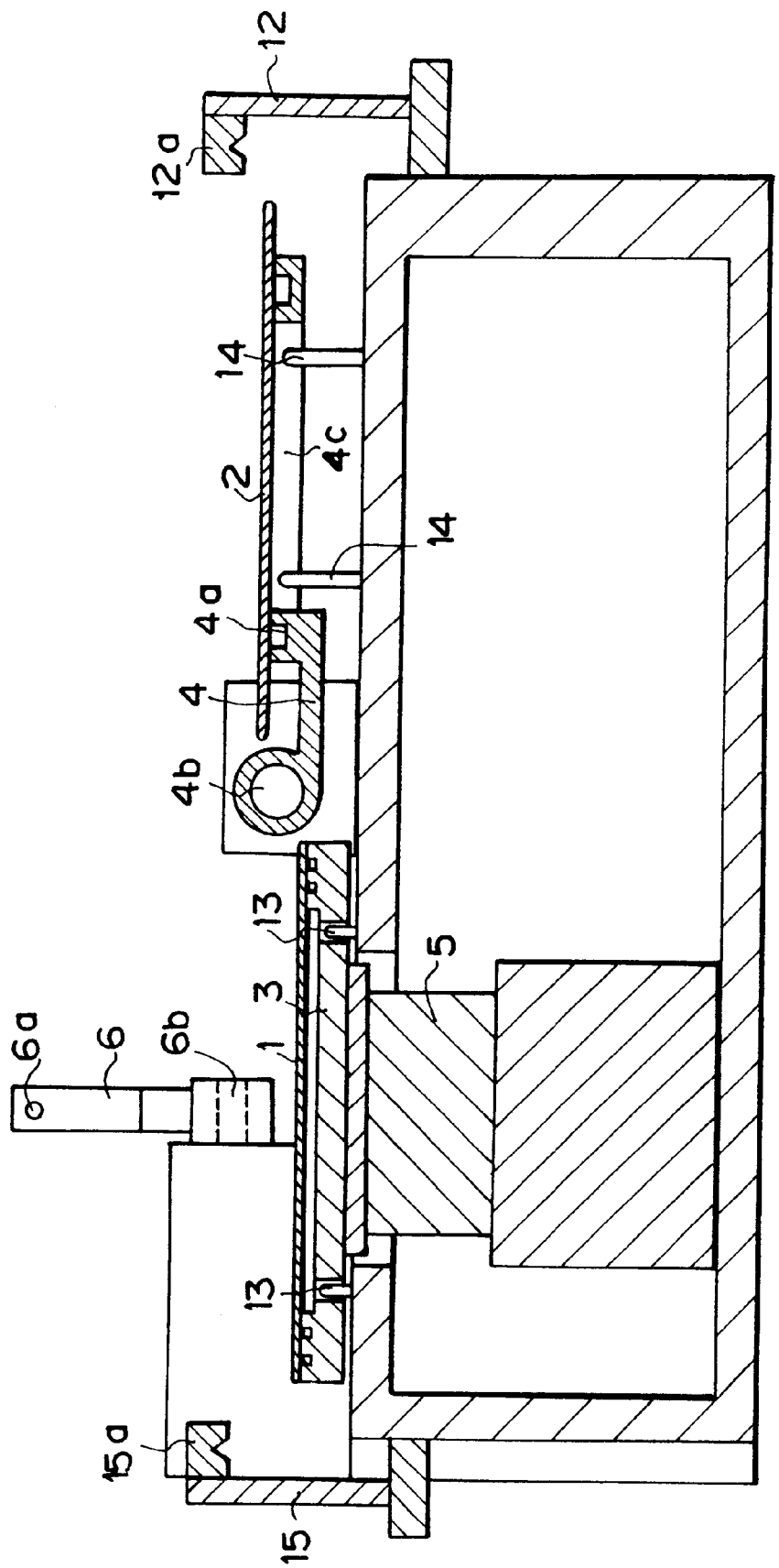
FIGS. 5 to 9 are sectional views of the wafer processing apparatus shown in FIGS. 1 and 2 taken along a line A–A'.

When the wafers 1 and 2 are mounted on the load pins 13 and 14 by the wafer transfer robot 10, respectively, the Z-axis stage 5 moves the wafer support table 3 upward to a predetermined position at which the wafer 1 is supported, and the wafer moving mechanism 4 pivots the wafer chuck portion 4c about the shaft 4b to a predetermined position at which the wafer 2 can be chucked, as shown in FIG. 5.

Figure 6:
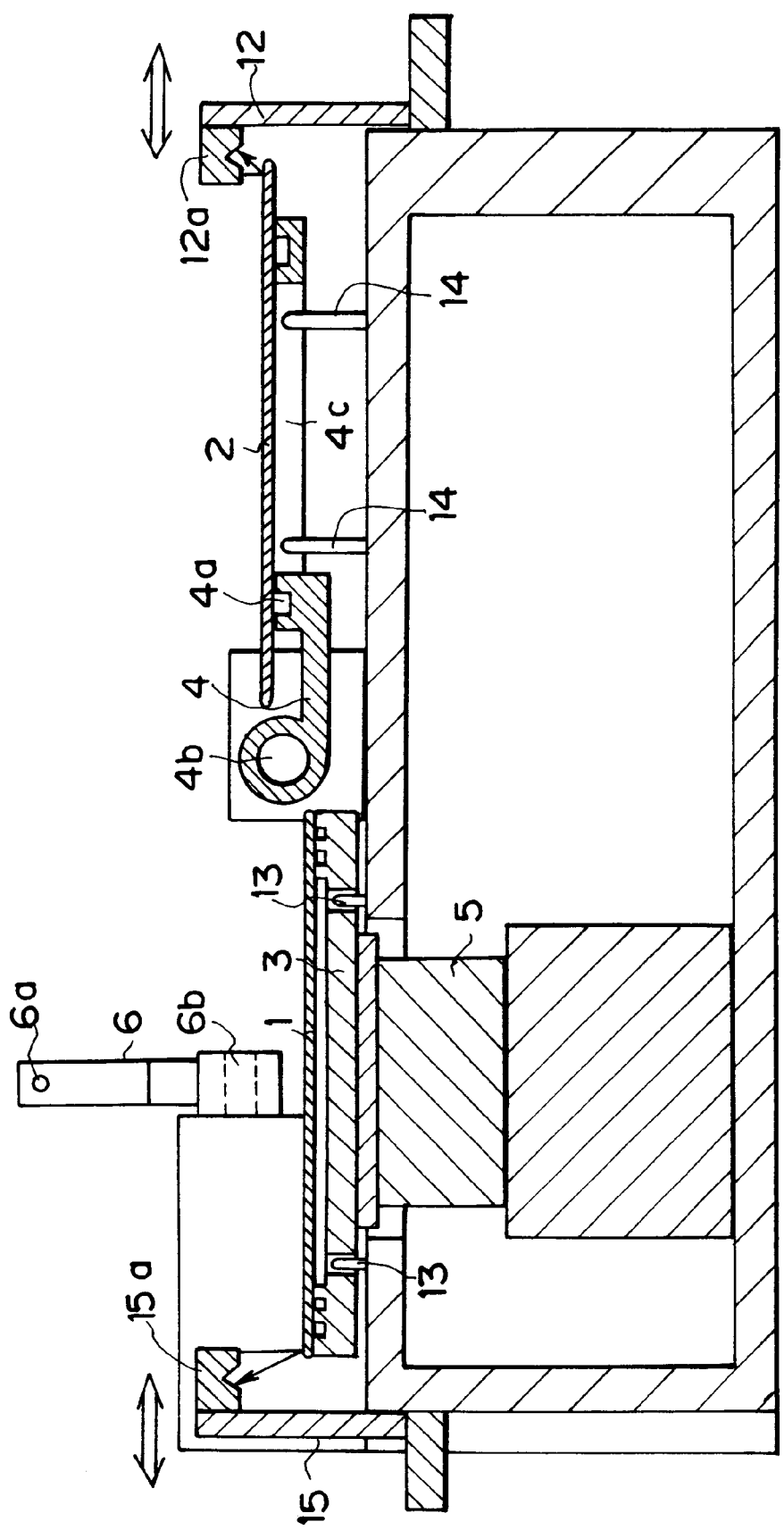

Next, as shown in FIG. 6, the sensors 15a and 12a of the displacement detection sections 15 and 12 move onto the wafers 1 and 2 to measure the thicknesses of the wafers 1 and 2, respectively. After the thicknesses of the wafers 1 and 2 are measured, the sensors 15a and 12a return to the initial positions shown in FIG. 5.

Figure 7:
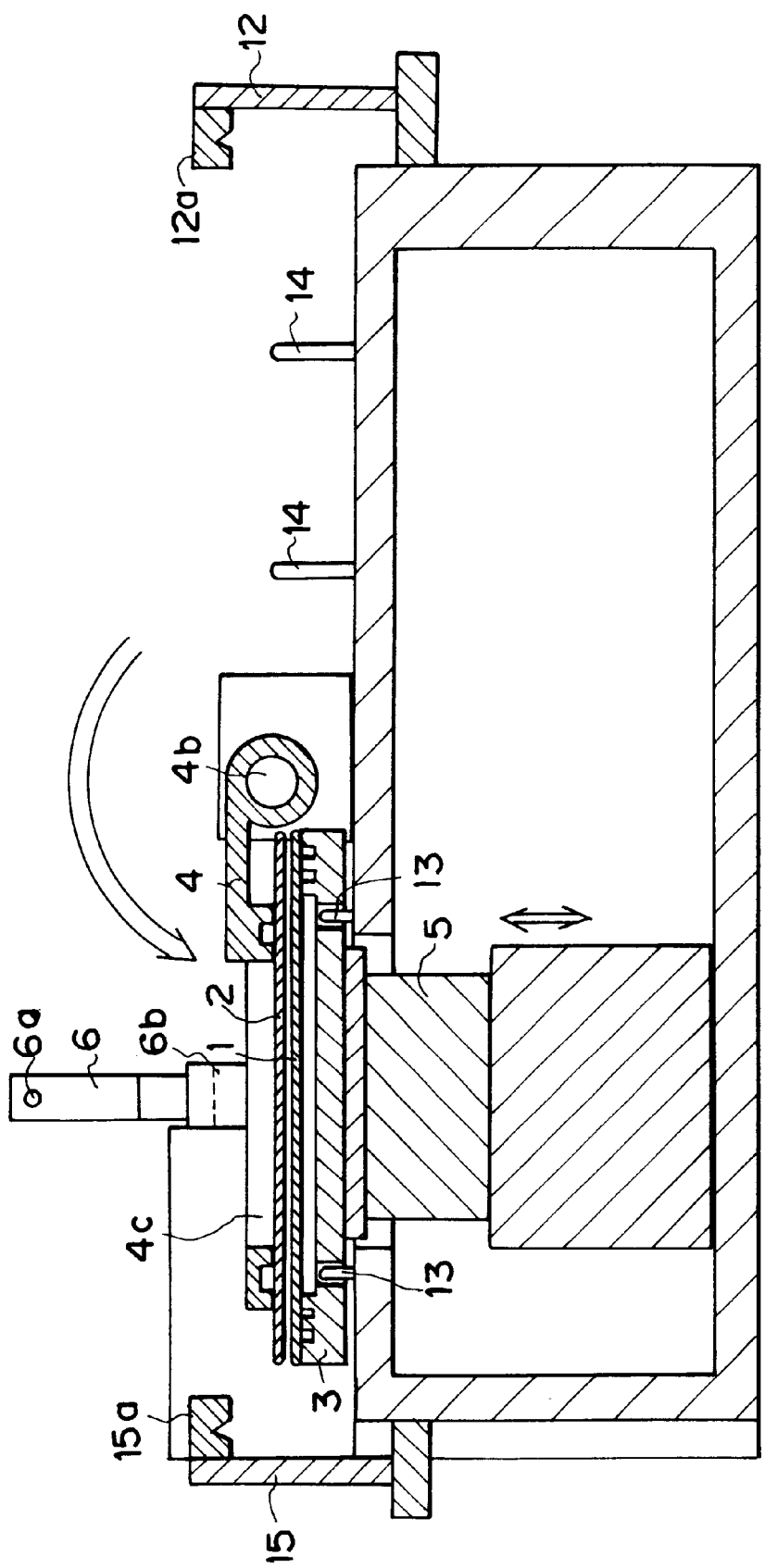

As shown in FIG. 7, the wafer moving mechanism 4 pivots the wafer chuck portion 4c about the shaft 4b through around 180° to make the wafers 1 and 2 opposite to each other almost in the horizontal direction. The height of the wafer support table 3 is adjusted by the Z-axis stage 5 on the basis of the measured thicknesses of the wafers 1 and 2 to set the gap between the wafers 1 and 2 at a set value. The gap is preferably 20 to 100 $\mu$m at the central portion of the wafers and, more preferably, 30 to 60 $\mu$m. The wafer processing apparatus 100 opens the valve 19 so that the peripheral portion of the lower surface of the wafer 1 is chucked by the chuck surface of the peripheral portion 3d of the wafer support table 3. With this operation, the wafer 1 is corrected to be almost flat.

Figure 8:
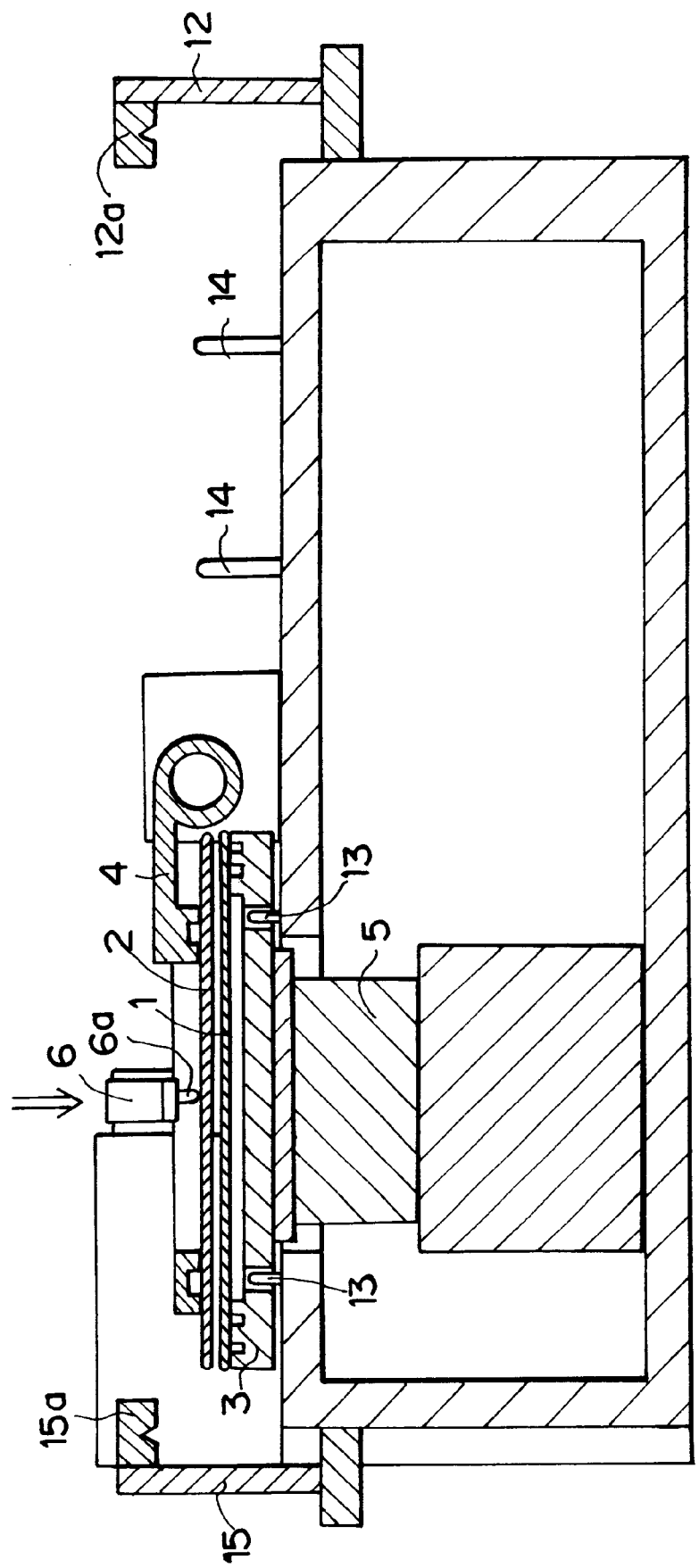

As shown in FIG. 8, the press pin 6a is pivoted about the shaft 6b to be close to the lower surface of the wafer 2 (e.g., a position at which the press pin 6a is substantially in contact with the lower surface of the wafer 2).

Figure 9:
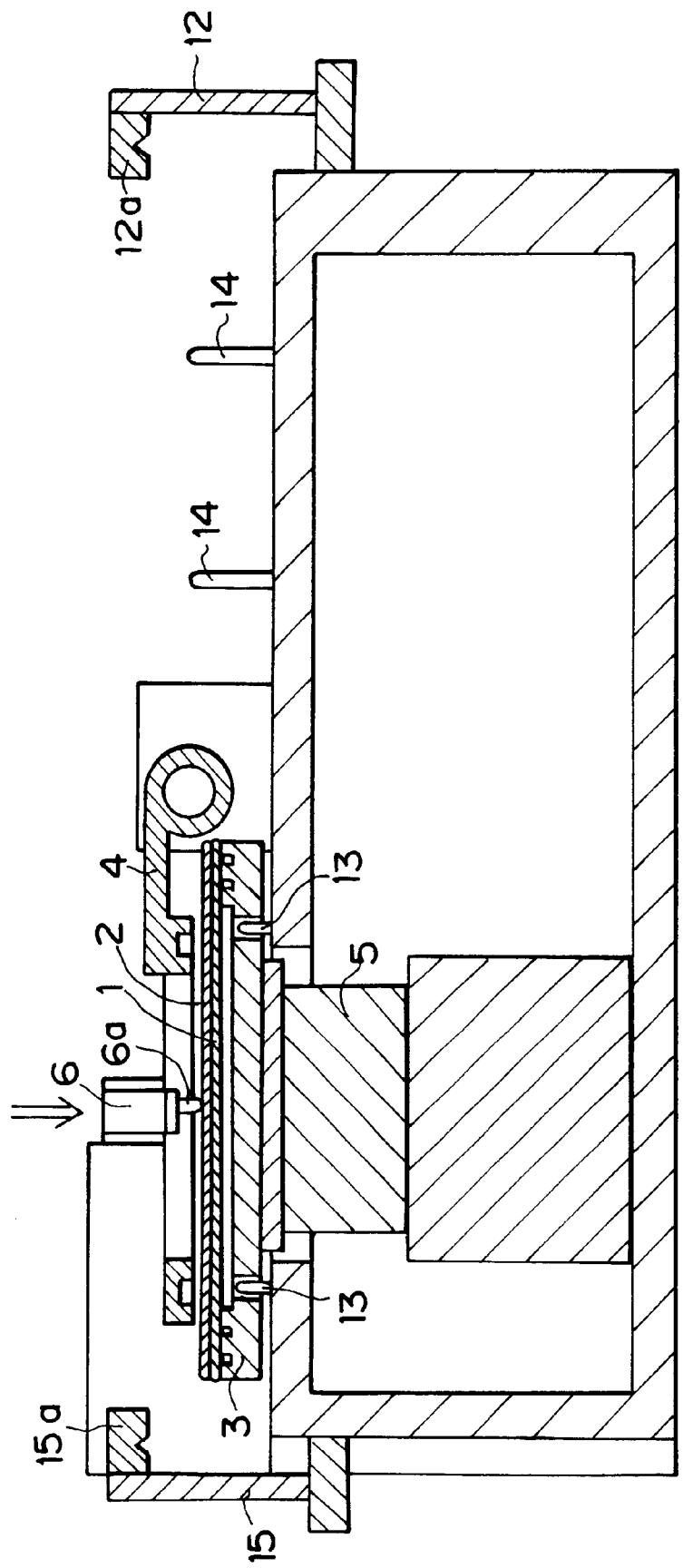

Subsequently, as shown in FIG. 9, the lower surface of the wafer 2 is pressed by the press pin 6a when chucking of the wafer 2 by the wafer chuck portion 4c is canceled. The wafers 1 and 2 gradually come into contact with each other outward from the central portion, and finally, the entire surfaces are in contact with each other.

After the press mechanism 6 is returned to the initial state (state shown in FIG. 5), the wafer chuck portion 4c is returned to the initial state (state shown in FIG. 5). The valve 19 is closed to set the interior of the chuck groove 3a to the atmospheric pressure (chucking of the wafer 1 is canceled), and then, the wafer support table 3 is moved downward, so that the wafers in contact with each other are supported by the load pins 13. In this state, the wafer transfer robot 10 chucks the lower surface of the wafers in contact with each other, transfers them to the wafer cassette 9, and stores them in the wafer cassette 9.

Figure 10:
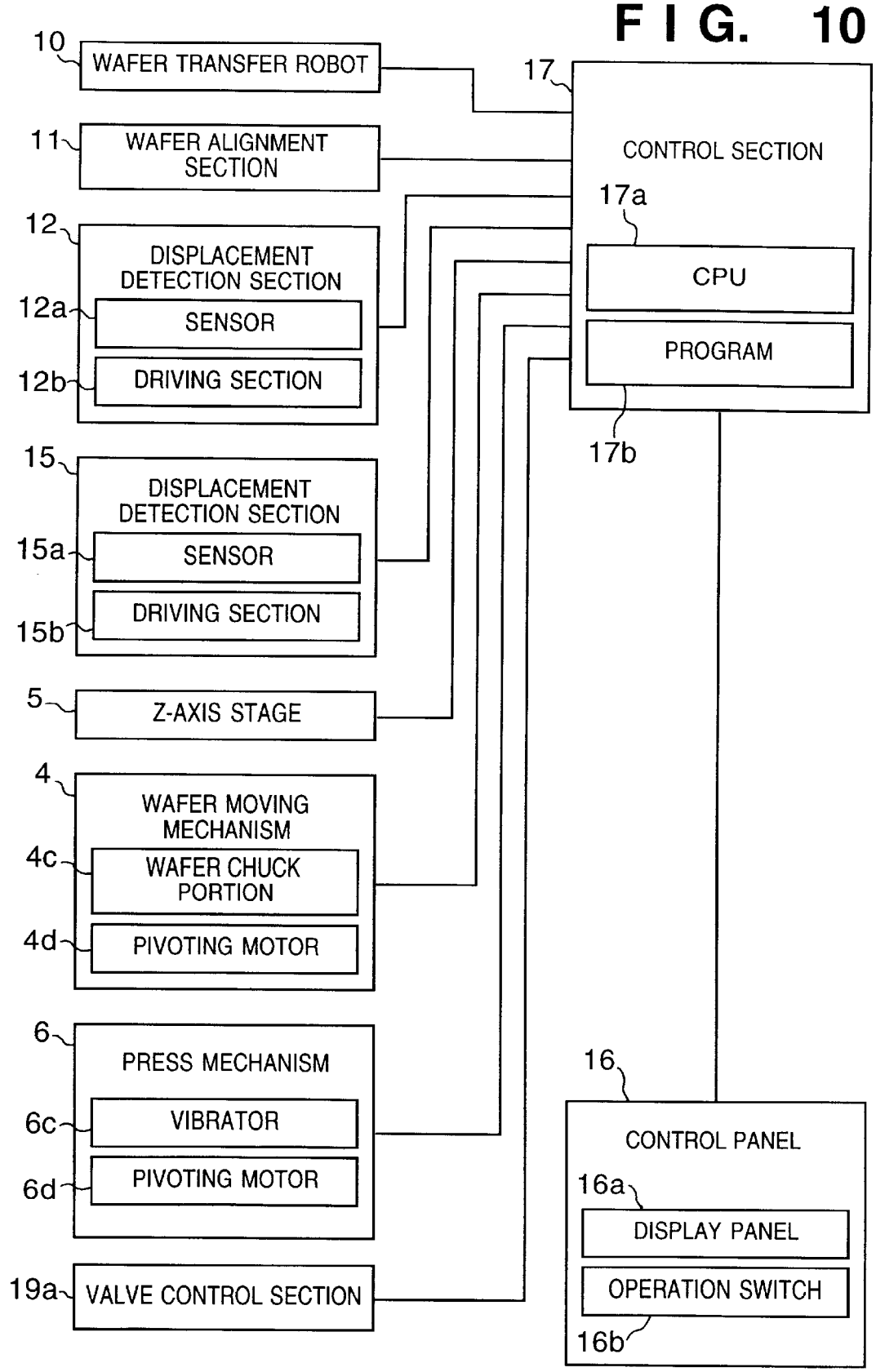
FIG. 10 is a block diagram showing the arrangement of the control system of the wafer processing apparatus.

FIG. 10 is a block diagram showing the arrangement of the control system of the wafer processing apparatus 100. A control section 17 controls the wafer transfer robot 10, the wafer alignment section 11, the displacement detection sections 12 and 15, the Z-axis stage 5, the wafer moving mechanism 4, the press mechanism 6, the panel section 16, and a valve control section 19a by a CPU 17a which operates on the basis of a program 17b.

Figure 11:
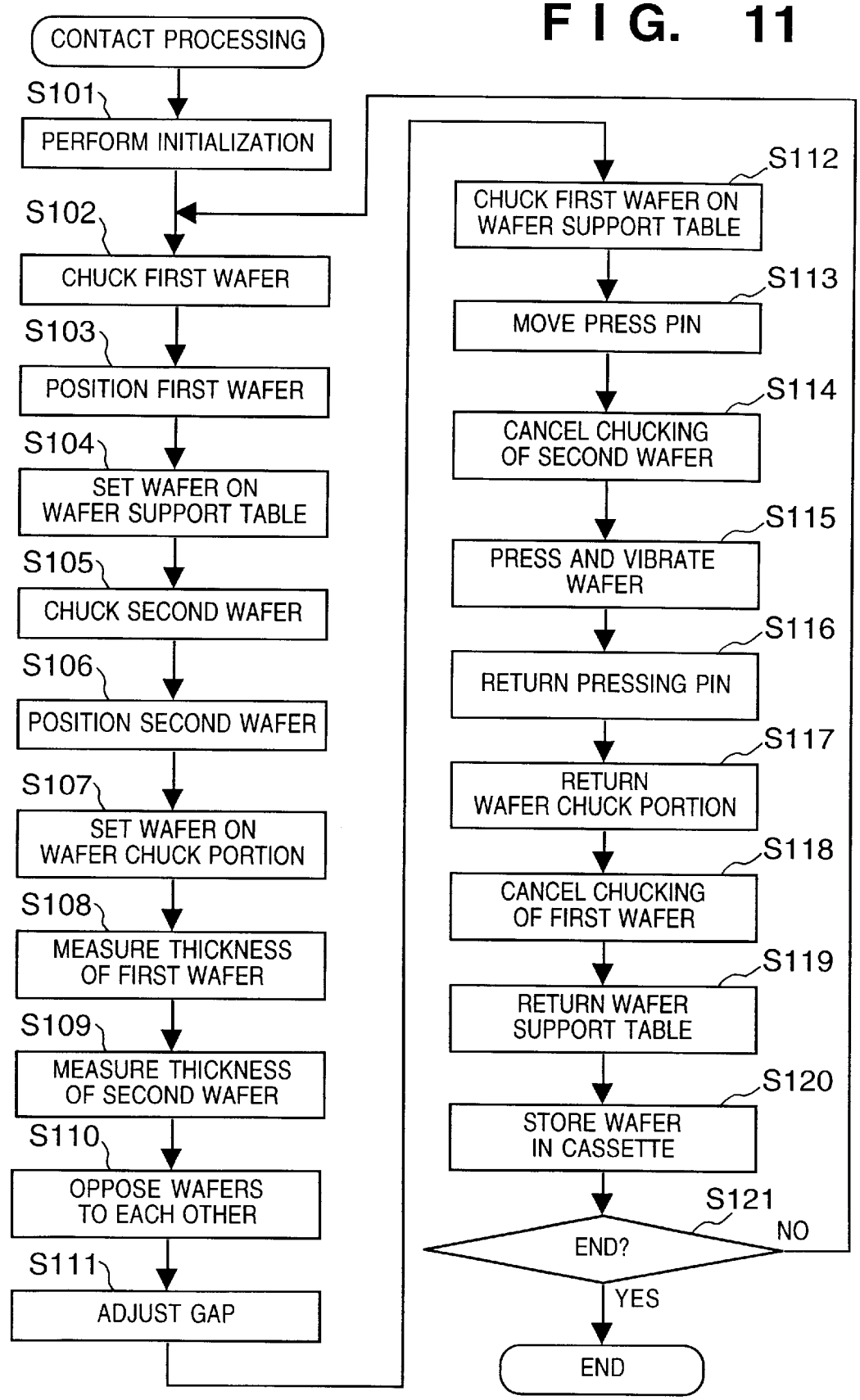
FIG. 11 is a flow chart showing the control procedure based on a program.

FIG. 11 is a flow chart showing the control procedure based on the program 17b. The operation of the control system of the wafer processing apparatus 100 will be described with reference to the flow chart.

When the start of contact processing is instructed by operating the operation switch 16b, constituent elements connected to the control section 17 are initialized in step S101. In this initialization step, the presence and positions of the wafer cassettes 7, 8, and 9 are also confirmed. If preparation is not complete, this is indicated on a display panel 16a to warn the operator.

In step S102, a wafer 1 stored in the wafer cassette 7 is chucked by controlling the wafer transfer robot 10. In step S103, the chucked wafer 1 is transferred to the wafer alignment section 11 and aligned (central position and direction). In step S104, the wafer 1 is set at a predetermined position on the load pins 13 projecting from the wafer support table 3 by controlling the wafer transfer robot 10. The wafer support table 3 is moved upward to a predetermined position by controlling the Z-axis stage 5.

In step S105, a wafer 2 stored in the wafer cassette 8 is chucked by controlling the wafer transfer robot 10. In step S106, the wafer 2 is transferred to the wafer alignment section 11 and aligned (central position and direction). In step S107, the wafer 2 is set at a predetermined position on the load pins 14 projecting from the wafer chuck portion 4c by controlling the wafer transfer robot 10. The wafer chuck portion 4c is pivoted about the shaft 4b through a predetermined angle by controlling a pivoting motor 4d of the wafer moving mechanism 4, so the wafer 2 is chucked by the wafer chuck portion 4c.

In step S108, the sensor 15a is moved to a predetermined position on the wafer 1 by controlling a driving section 15b of the displacement detection section 15, so the thickness of the wafer 1 is measured by the sensor 15a.

In step S109, the sensor 12a is moved to a predetermined position on the wafer 2 by controlling a driving section 12b of the displacement detection section 12, so the thickness of the wafer 2 is measured by the sensor 12a.

In step S110, the wafer chuck portion 4c is pivoted about the shaft 4b through about 180° by controlling the pivoting motor 4d of the wafer moving mechanism 4 to make the wafers 1 and 2 opposite to each other almost in the horizontal direction.

In step S111, data for adjusting the gap between the wafers 1 and 2 to a set value is prepared on the basis of the measurement result of the thicknesses of the wafers 1 and 2. The Z-axis stage 5 is controlled on the basis of the data to adjust the gap between the wafers 1 and 2.

In step S112, the valve control section 19a opens the valve 19, so the first wafer 1 is chucked by the wafer support table 3.

In step S113, the press pin 6a is pivoted about the shaft 6b by controlling a pivoting motor 6d of the press mechanism 6 until the distal end portion of the press pin 6a roughly contacts the lower surface of the wafer 2.

In step S114, chucking of the wafer 2 by the wafer. chuck portion 4c is canceled. In step S115, the pivoting motor 6d and a vibrator 6c of the press mechanism 6 are controlled to press the press pin 6a against the lower surface of the wafer 2 and simultaneously vibrate the press pin 6a. When step S115 is executed immediately after step S114, cancel of chucking of the wafer 2 and pressing can be performed almost simultaneously. Pressing may be started after step S114, e.g., after a predetermined time is counted.

When the wafers 1 and 2 are completely in contact with each other, the pivoting motor 6d of the press mechanism 6 is controlled to return the press pin 6a to the initial position in step S116. In step S117, the pivoting motor 4d of the wafer moving mechanism 4 is controlled to return the wafer chuck portion 4c to the initial position.

In step S118, the valve 19 is closed to return the interior of the chuck grooves 3a and 3b to the atmospheric pressure, thereby canceling chucking of the wafer 1. In step S119, the Z-axis stage 5 is controlled to move the wafer support table 3 downward to the initial state. With this operation, the wafers in contact with each other are supported by the load pins 13.

In step S120, the wafer transfer robot 10 is controlled to transfer the wafers in contact with each other to the wafer cassette 9 and store them in the wafer cassette 9.

In step S121, it is determined whether contact processing has been performed for all wafers stored in the wafer cassettes 7 and 8. If wafers which have not been processed yet remain, the flow returns to step S102 to repeat the processing. If it is determined that contact processing has been performed for all wafers, the series of processing operations are ended. At this time, the operator is preferably notified of the end of processing by an indication on the display panel 16a or a buzzer sound.

As described above, according to the wafer processing apparatus 100, 1) since pressing is started in synchronism with cancel of chucking of the upper wafer 2, the gas between the wafers 1 and 2 can be properly removed outward, 2) since the upper wafer 2 does not slide when the wafers 1 and 2 oppose each other, the two wafers 1 and 2 can be properly positioned, 3) since the gap between the wafers 1 and 2 can be adjusted to an appropriate distance, the quality of the manufactured wafer can be more uniform and the wafers 1 and 2 need not be classified in advance, 4) the surfaces of the wafers 1 and 2 can be prevented from being contaminated by particles, 5) damage to the peripheral portions of the wafers can be prevented, and 6) gas entrapment between the wafers can be decreased by vibrating the wafers during pressing.

In addition, according to the wafer processing apparatus 100, only the peripheral portion 3d of the wafer support table 3 comes into contact with the lower surface of the first wafer 1. For this reason, even when particles adhere to the central portion 3c of the wafer support table 3 or the central portion of the lower surface of the first wafer 1, the first wafer can be supported in an almost flat state. In other words, unevenness on the supported wafer 1 due to particles which may adhere to the central portion of the wafer support table or the first wafer can be prevented. Therefore, when the two wafers are brought into contact with each other, gas entrapment between the wafers can be effectively prevented.

[Second Embodiment]

Figure 12:
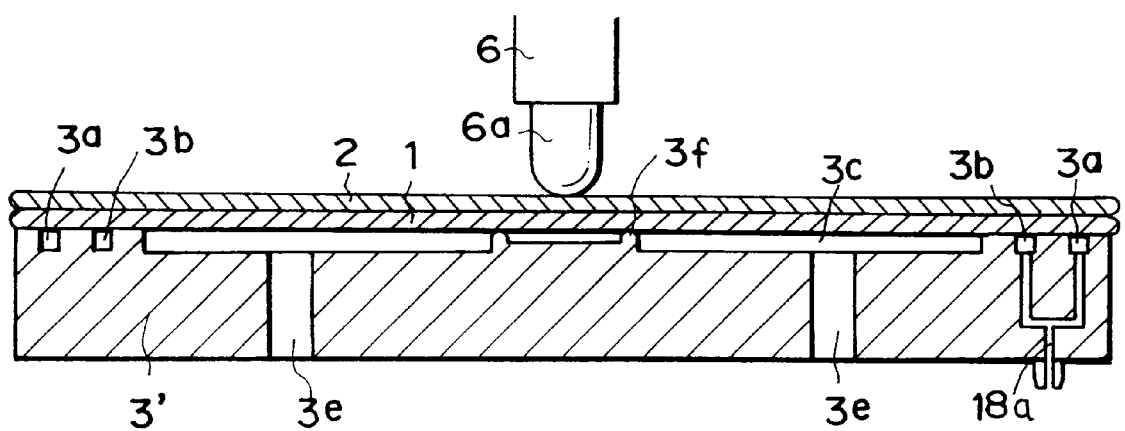
FIG. 12 is a sectional view showing the structure of a wafer support table according to the second embodiment.

In the second embodiment, the structure of the wafer support table 3 of the wafer processing apparatus 100 according to the first embodiment is modified. The arrangement of members other than the wafer support table is the same as in the first embodiment. FIG. 12 is a sectional view showing the structure of a wafer support table 3' according to the second embodiment. The wafer support table 3' is particularly suitable to bring large-diameter wafers into contact with each other.

The wafer support table 3' of the second embodiment has, near its central portion, a deflection prevention portion 3f for preventing a wafer 1 from deflecting due to its weight or pressing by a press pin 6a. That table portion where the deflection prevention portion 3f comes in contact with the first wafer 1 and that table portion where a peripheral portion 3b comes in contact with the first wafer 1 are preferably substantially positioned in the same plane. In the example shown in FIG. 12, the portion where the deflection prevention portion 3f comes in contact with the wafer has an annular shape. Another shape (e.g., a matrix or needlepoint array) may be employed. The wafer support table 3' can be manufactured by, e.g., lapping.

The deflection prevention portion 3f is preferably located near the center of the wafer support table 3'. However, even when the deflection prevention portion 3f is located at an arbitrary position in a central portion 3c, the same effect as described above can be obtained.

As described above, when the deflection prevention portion 3f is used, the first wafer 1 can be prevented from deflecting, and the influence of particles can be reduced, as in the first embodiment.

[Application Example of Wafer Processing Apparatus]

An application example of the wafer processing apparatus according to the first or second embodiment will be described below. FIGS. 13A to 13F are views showing steps in manufacturing a wafer having, e.g., an SOI structure.

Figure 13A:
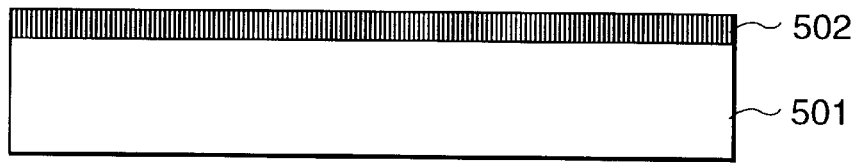
FIGS. 13A to 13F are views showing steps in manufacturing a wafer having, e.g., an SOI structure.
Figure 13B:
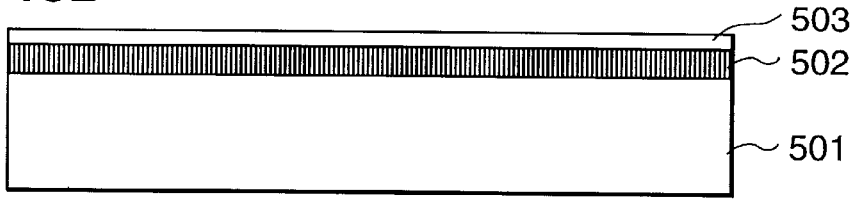

A single-crystalline Si wafer 501 for forming the first wafer 1 is prepared. A porous Si layer 502 is formed on a major surface of the single-crystalline Si wafer 501 (FIG. 13A). At least one non-porous layer 503 is formed on the porous Si layer 502 (FIG. 13B). As the non-porous layer 503, a single-crystalline Si layer, a polycrystalline Si layer, an amorphous Si layer, a metal layer, a semiconductor compound layer, or a superconductor layer is suitable. A device such as a MOSFET may be formed on the non-porous layer 503.

Figure 13C:
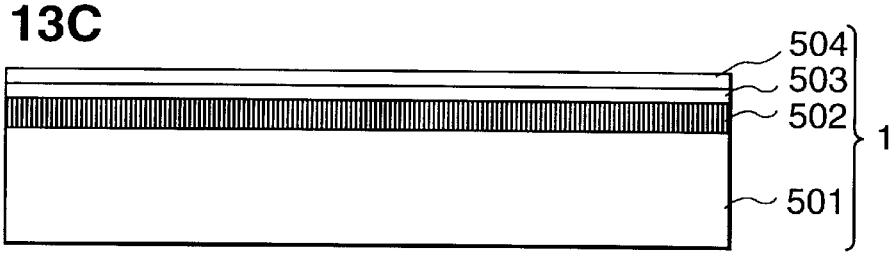
Figure 13D:
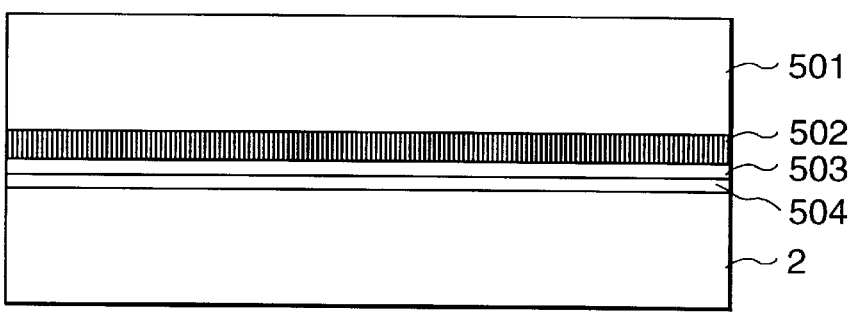

An $SiO_2$ layer 504 is formed on the non-porous layer 503 to obtain a first wafer 1 (FIG. 13C). The first wafer 1 with the $SiO_2$ layer 504 facing up is stored in a wafer cassette 7.

A second wafer 2 is prepared. The second wafer 2 with its surface facing up is stored in a wafer cassette 8.

The wafer shown in FIG. 13C may be stored in the wafer cassette 8 as the second wafer while another wafer may be stored in the wafer cassette 7 as the first wafer. In this case, the wafer shown in FIG. 13C is transferred to the wafer support table 3, and another wafer is transferred to a wafer moving mechanism 4.

In this state, the wafer processing apparatus is operated. The first wafer 1 and the second wafer 2 come into contact with each other while sandwiching the $SiO_2$ layer 504 (FIG. 13D), and stored in a wafer cassette 9.

The wafers in contact with each other (FIG. 13D) may be subjected to anode bonding, pressing, or heat treatment, as needed, or these processing operations may be combined to firmly bond the wafers.

As the second wafer 2, an Si wafer, an Si wafer with an $SiO_2$ layer formed thereon, a transparent wafer consisting of silica glass, or a sapphire wafer is suitably used. However, any other wafer can be used as the second wafer 2 as far as it has a sufficiently flat surface to be bonded.

Figure 13E:
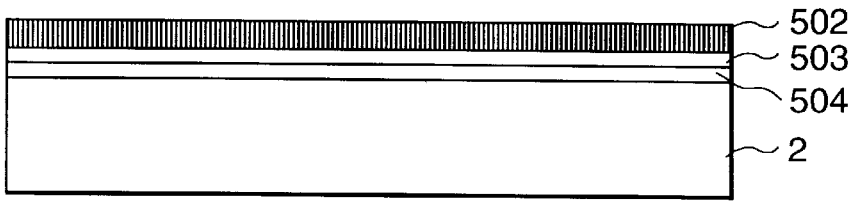
Figure 13F:
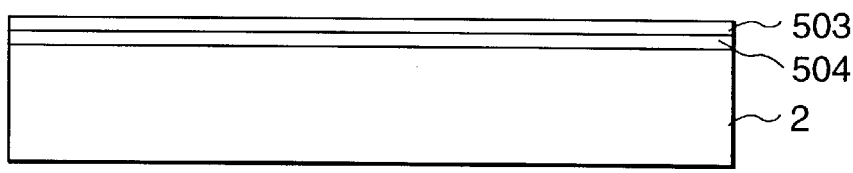
Figure 14A:
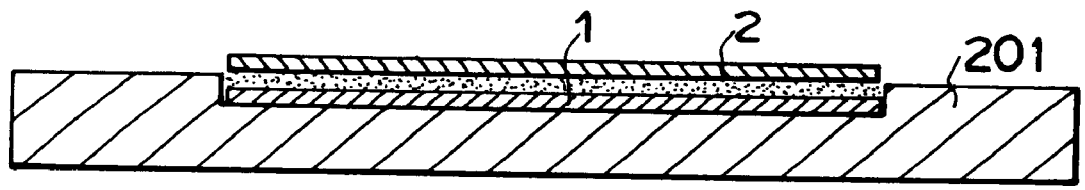
FIGS. 14A and 14B are schematic views showing steps in bonding wafers.
Figure 14B:
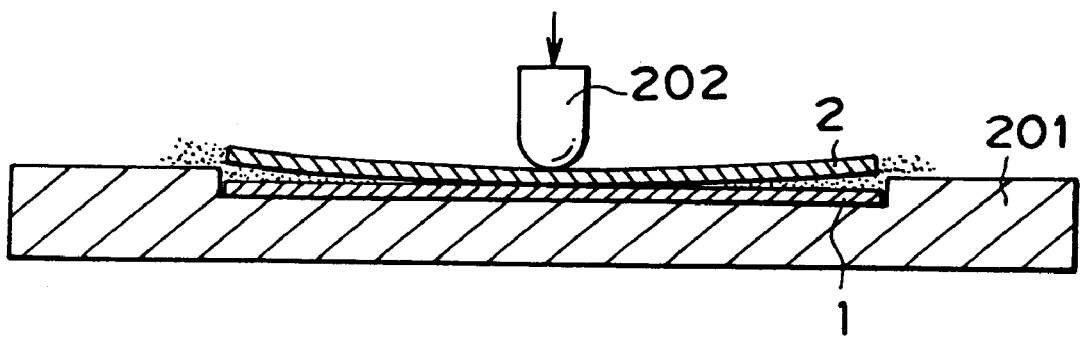
Figure 15:
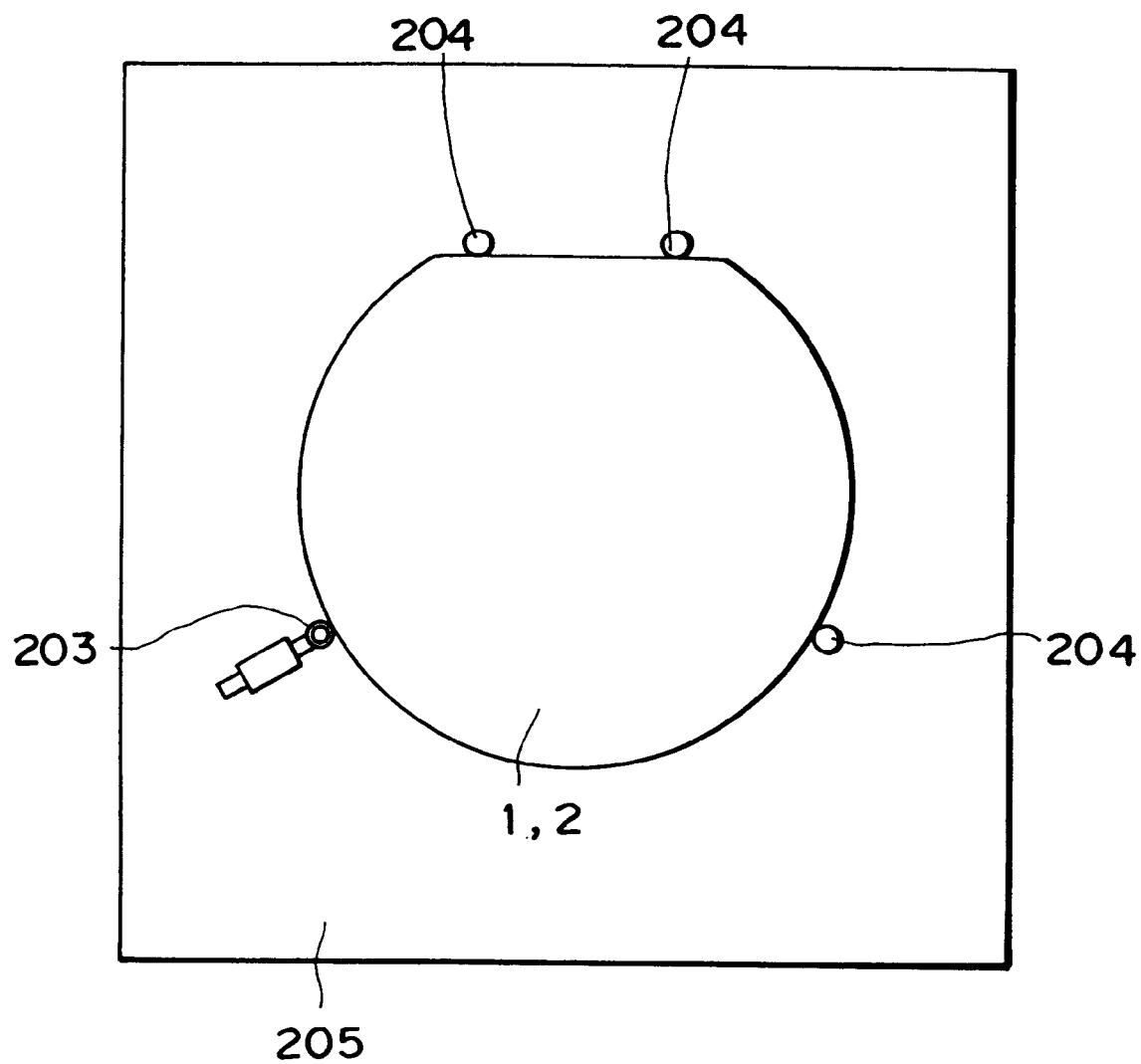
FIG. 15 is a view showing an example of a jig for overlaying two wafers while positioning them.

Next, the first wafer 1 is removed from the second wafer 2 to expose the porous Si layer 502 (FIG. 13E). The porous Si layer 502 is selectively etched and removed. FIG. 13F schematically shows the wafer obtained by the above manufacturing method.

According to this manufacturing method, the two wafers are brought into contact with each other while appropriately removing any gas between the wafers, so a high-quality wafer can be manufactured.

According to the present invention, substrates can be brought into contact with each other at high quality without leaving any gas entrapped. [Third Embodiment]

Figure 16:
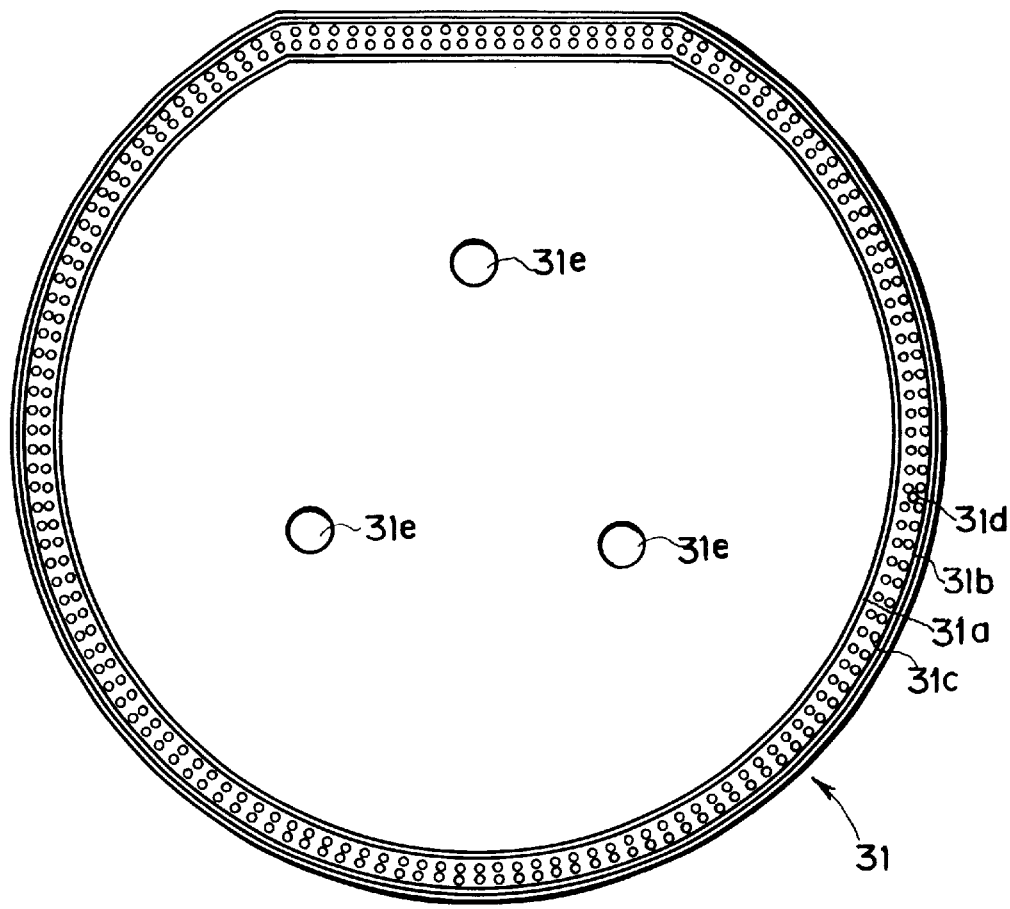
FIG. 16 is a plan view showing the arrangement of a wafer support table according to the third embodiment of the present invention.

FIG. 16 is a plan view showing the arrangement of a wafer (substrate) support table 31 according to the third embodiment of the present invention.

The wafer support table 31 can be manufactured by fabricating a generally commercially available silicon wafer, e.g., a silicon wafer for manufacturing a semiconductor device complying with the SEMI standard or JAIDA standard. A wafer used to manufacture a semiconductor device has high surface planarity. For this reason, when the surface is used as a chuck surface for chucking a wafer to be supported, a high-precision wafer support table can be easily manufactured. Hence, a wafer support table excellent in mass productivity and cost can be obtained.

For example, the general lithography technique can be employed to fabricate the silicon wafer. Since a pattern can be formed at an accuracy of, e.g., submicron order, lithography is applicable to manufacture the wafer support table according to the third embodiment.

The wafer support table 31 has two bank-shaped sealing portions 31a and 31b and a suction port 31d. The gas in the space defined by the two sealing portions 31a and 31b and the wafer to be chucked and supported is exhausted through the suction port 31d, thereby chucking the wafer.

On the wafer support table 31, a number of pin-shaped deflection prevention portions 31c is formed between the sealing portions 31a and 31b to prevent the chucked wafer from deflecting upon reducing the pressure between the two sealing portions 31a and 31b. In this embodiment, the deflection prevention portions 31c are formed only between the sealing portions 31a and 31b. However, the deflection prevention portions 31c may be formed at the central portion.

As the surfaces of the sealing portions 31a and 31b and the deflection prevention portions 31c which come in contact with the object to be chucked, the surface of the silicon wafer as the material of the wafer support table 31 is directly used.

The wafer support table 31 has pin holes 31e in which load pins (to be described later) used to load/unload the wafer to be chucked are inserted.

Figure 17:
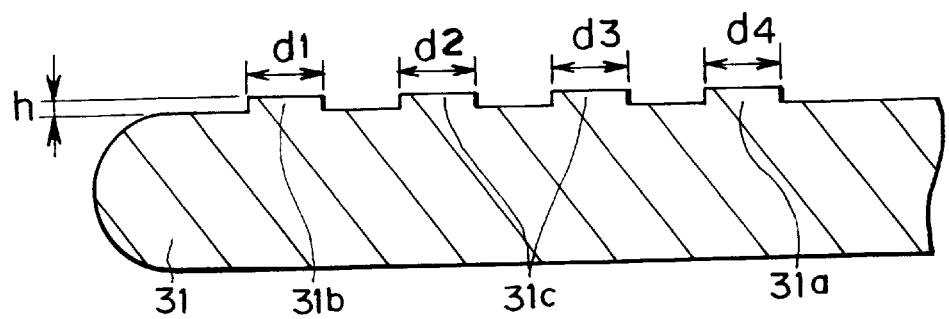
FIG. 17 is a sectional view of part of the wafer support table shown in FIG. 16.

FIG. 17 is a sectional view showing part of the wafer support table 31 shown in FIG. 16. A height h of the sealing portions 31a and 31b and the deflection prevention portions 31c is preferably about 50 µm. Widths d4 and d1 of the sealing portions 31a and 31b are preferably made small to some extent to prevent particles from being sandwiched by the sealing portions 31a and 31b and the wafer to be chucked, and the widths are preferably, e.g., approximately 0.2 mm. From the same viewpoint, the diameter of the deflection prevention portions 31c is preferably made small to some extent, and the diameter is preferably, e.g., about 0.2 mm.

Figure 18:
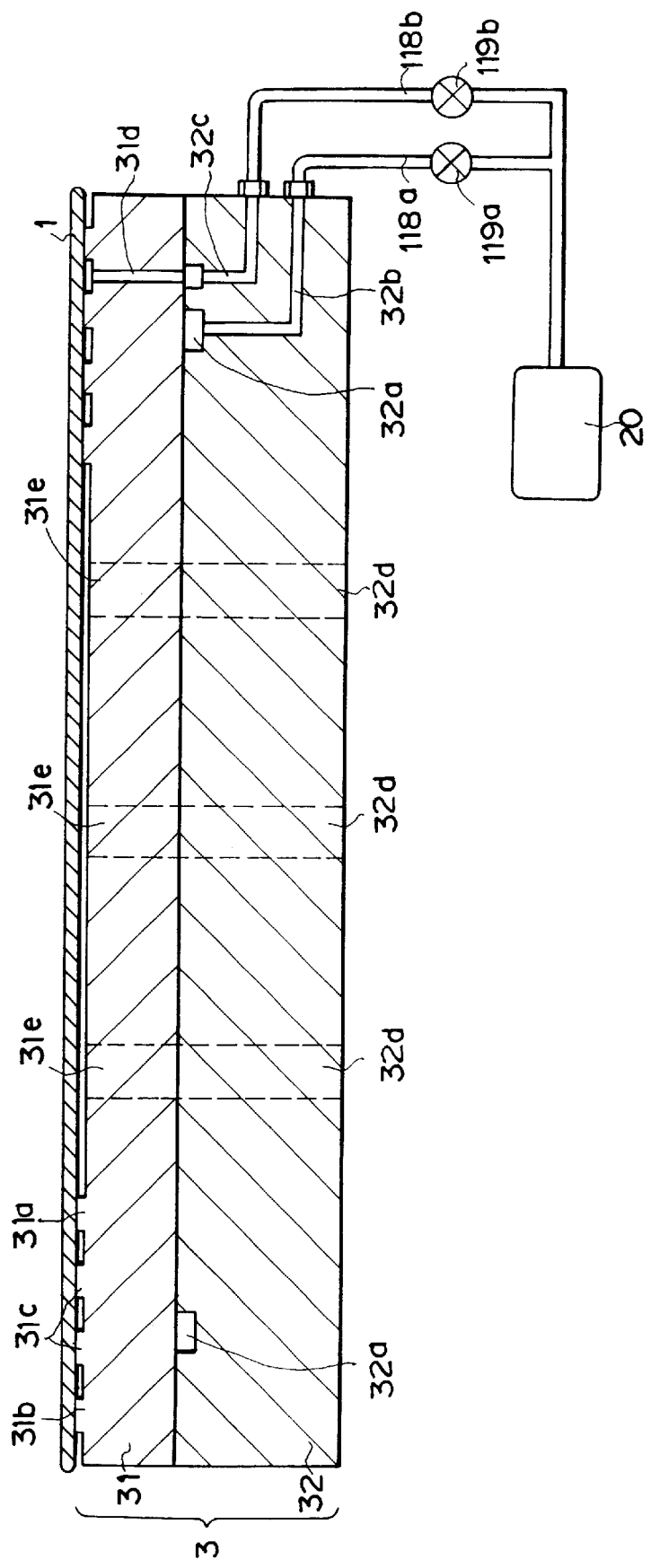
FIG. 18 is a sectional view showing the arrangement of a wafer support apparatus including the wafer support table shown in FIG. 16.

FIG. 18 is a sectional view showing the arrangement of a wafer support apparatus 3 including the wafer support table 31 shown in FIG. 16. This wafer support apparatus 3 is constructed by vacuum-chucking the wafer support table 31 on a base 32.

The base 32 has an annular groove 32a for vacuum-chucking the wafer support table 31, and a suction hole 32b for exhausting the gas in the groove 32a. The wafer support table 31 is chucked by reducing the pressure in the groove 32a. The suction hole 32b is connected to a vacuum pump 20 through a pipe 118a having a valve 119a midway.

The base 32 also has a suction hole 32c for coupling the suction port 31d communicating with the lower surface of the wafer support table 31 to the vacuum pump 20 through a pipe 118b having a valve 119b midway.

When the wafer support table 31 is to be mounted on the base 32, the valve 119a is opened. When the wafer 1 to be processed is to be mounted on the wafer support table 31, the valve 119b is opened.

The base 32 also has pin holes 32d in which the load pins used to load/unload the wafer 1 on/from the wafer support table 31 are inserted.

The wafer support table 31 is preferably regularly cleaned to remove particles which may adhere to the chuck surface of the wafer 1. As described above, when the wafer support table 31 is manufactured by fabricating the silicon wafer used to manufacture a semiconductor device, a commercially available wafer carrier can be used for cleaning. In this case, the wafer support table 31 can be accommodated in the commercially available wafer carrier and cleaned using a general wafer cleaning apparatus.

Steps in manufacturing the wafer support table 31 will be described below. FIGS. 19A to 19N are views showing steps in manufacturing the wafer support table 31 by applying the general lithography technique.

An Si wafer 201a for manufacturing a semiconductor device is prepared. As shown in FIG. 19A, a film 202a for forming a mask pattern which is to be used in etching the Si wafer 201a later is formed on the upper, lower, and side surfaces of the Si wafer 201a. As the material of the film 202a, $SiO_2$ by thermal oxidation or $Si_3N_4$ by CVD is preferably used.

Figure 19B:
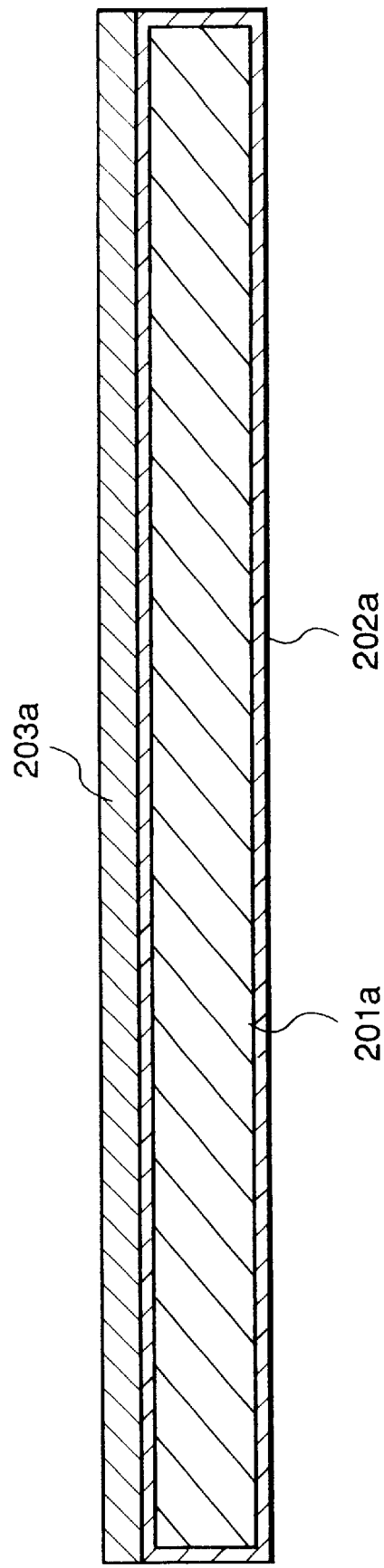
FIGS. 19A to 19N are views showing steps in manufacturing the wafer support table.

Next, as shown in FIG. 19B, a photoresist film 203a is formed on the wafer shown in FIG. 19A.

The photoresist film 203a is irradiated with UV light through a photomask (first mask) for forming the sealing portions 31a and 31b and the deflection prevention portions 31c, thereby printing a mask pattern. By developing the mask pattern, a patterned photoresist film 203b is formed, as shown in FIG. 19C. Since the fabrication accuracy in the planar direction can be lower than that required for a general semiconductor device, an exposure apparatus with low accuracy can be used to print the mask pattern.

Figure 19D:
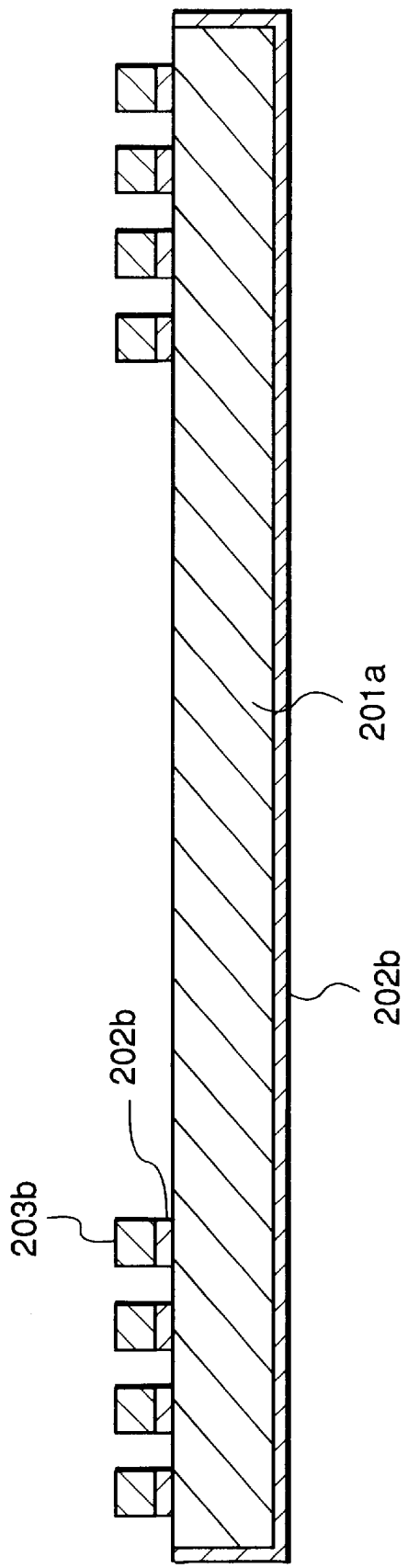

As shown in FIG. 19D, the film 202a is dry-etched using the photoresist film 203b as a mask, thereby exposing the Si wafer 201a. With this process, a patterned film 202b is formed on the Si wafer 201a. Next, as shown in FIG. 9E, the patterned photoresist film 203b is removed.

Figure 19F:
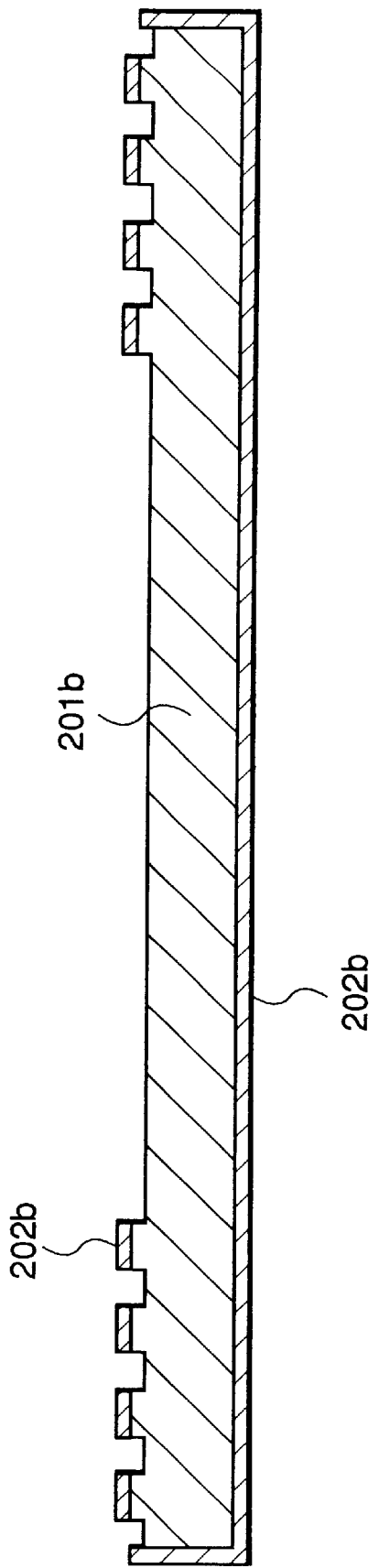

As shown in FIG. 19F, the wafer shown in FIG. 19E is etched. As this etching, wet etching using an alkali solution as an etchant is preferable. As the alkali solution, a solution of ammonia, or an organic ammonia-based solution can be used. For example, to form sealing portions 31a and 31b and a deflection prevention portions 31c having a height h of 50 µm, as shown in FIG. 18, the wafer 201a is etched to a depth of 50 µm.

Figure 19G:
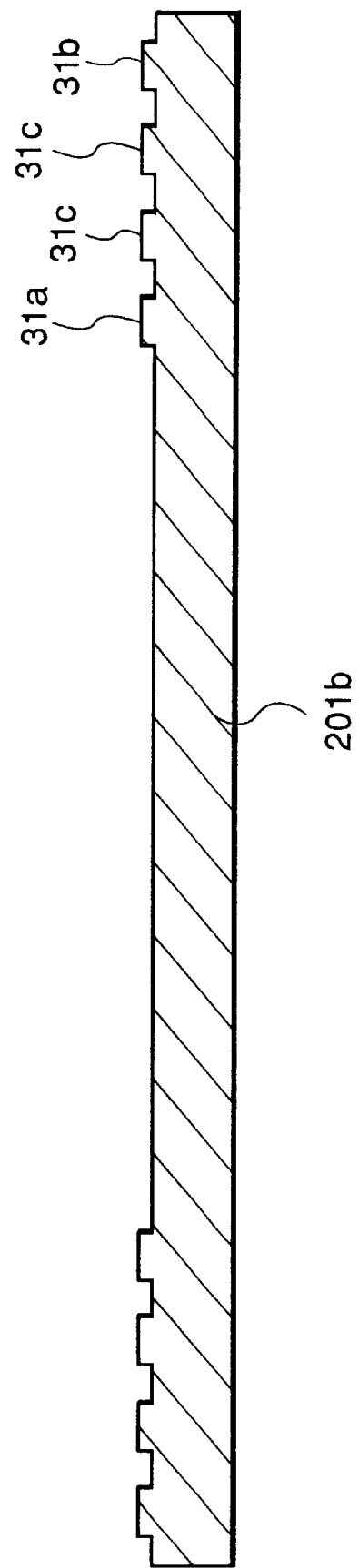

As shown in FIG. 19G, the patterned film 202b is removed using hydrofluoric acid. With this process, an Si wafer 201b having sealing portions 31a and 31b and the deflection prevention portions 31c is formed.

Figure 19H:
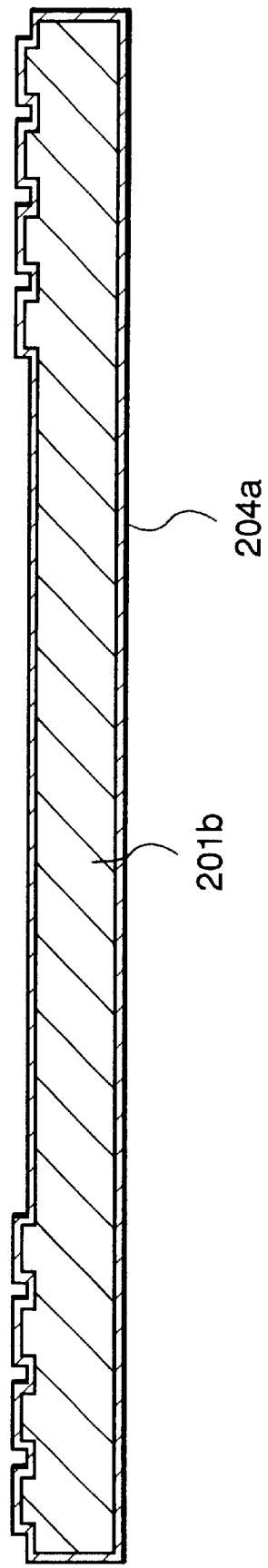

Subsequently, as shown in FIG. 19H, a film 204a for forming a mask pattern which is to be used in etching the Si wafer 201b later is formed on the upper, lower, and side surfaces of the Si wafer 201b having the sealing portions 31a and 31b and the deflection prevention portions 31c. As the material of the film 204a, $SiO_2$ by thermal oxidation or $Si_3N_4$ by CVD is preferably used.

Figure 19I:
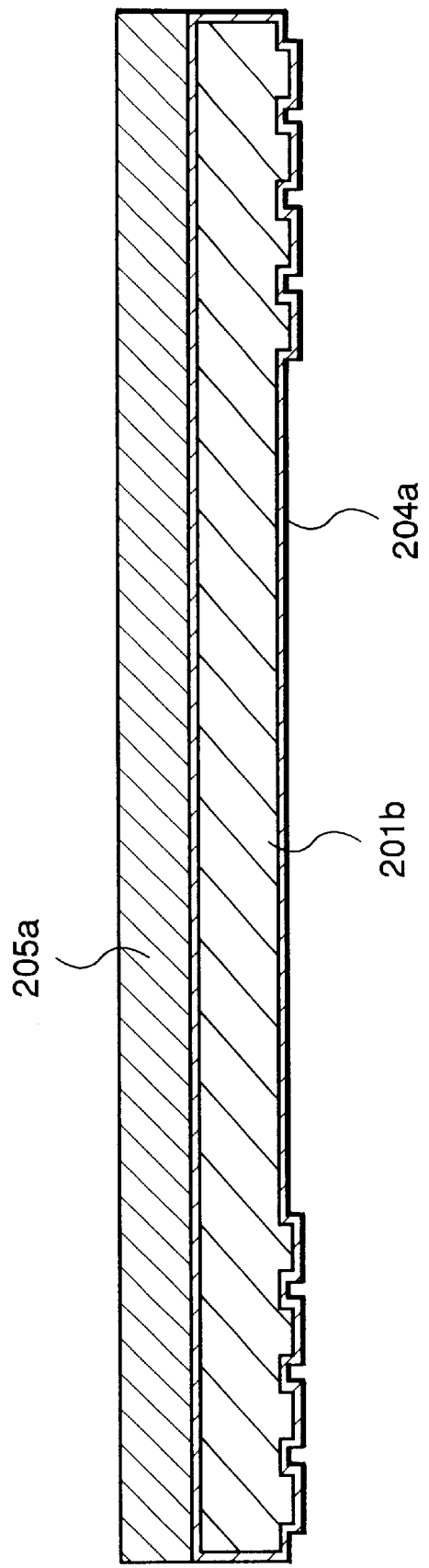

A photoresist film 205a is formed on the lower surface of the wafer shown in FIG. 19I (surface on the opposite side of the surface having the sealing portions 31a and 31b and the deflection prevention portions 31c).

Figure 19J:
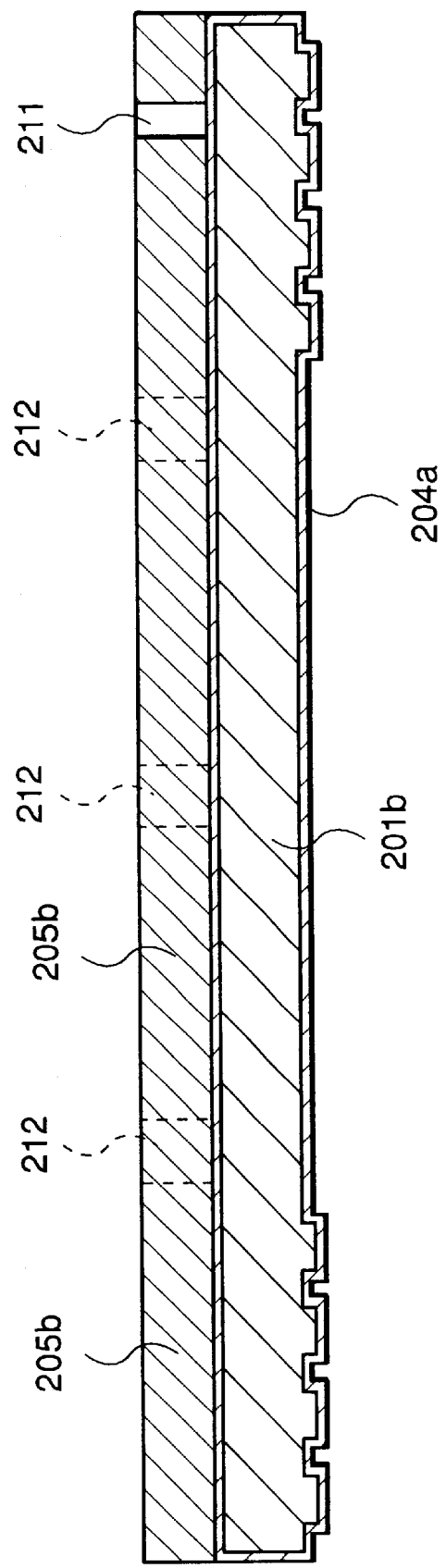

The photoresist film 205a is irradiated with UV light through a photomask (second mask) for forming a suction port 31d and pin holes 31e, thereby printing the mask pattern. By developing the mask pattern, a photoresist film 205b having a hole 211 for forming a suction port 31d and holes 212 for forming pin holes 31e are formed, as shown in FIG. 19J.

Figure 19K:
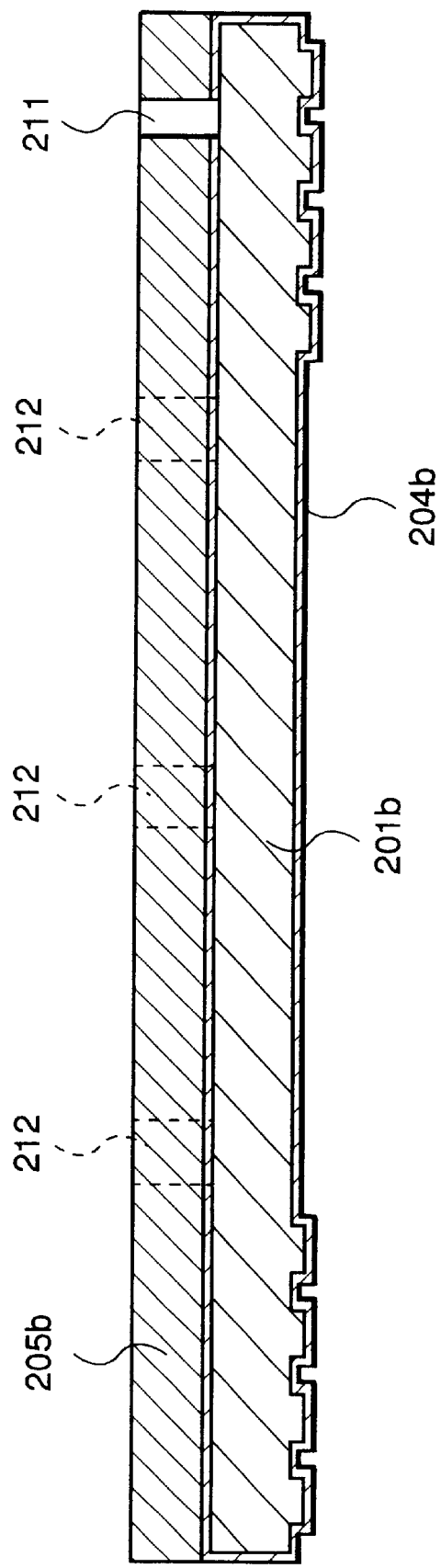
Figure 19L:
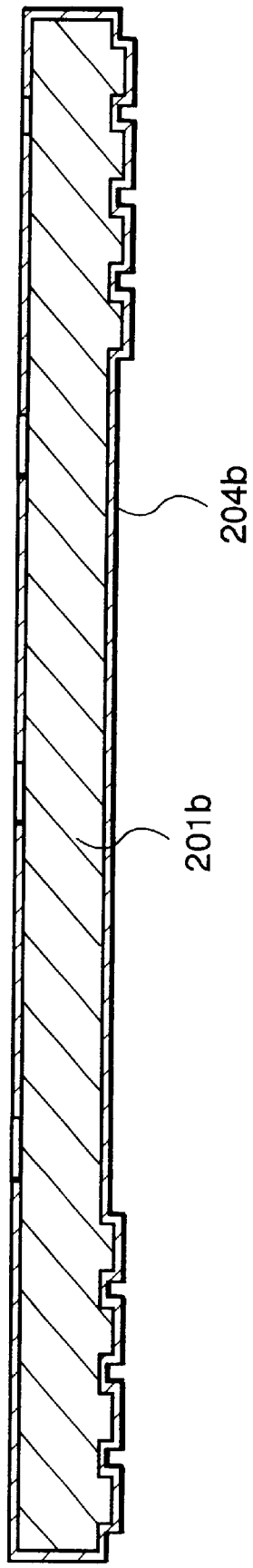

As shown in FIG. 19K, the film 204a is dry-etched using the photoresist film 205b as a mask, thereby exposing the Si wafer 201b. With this process, a patterned photoresist film 204b is formed on the Si wafer 201b. As shown in FIG. 19L, the patterned photoresist film 204b is removed.

Figure 19M:
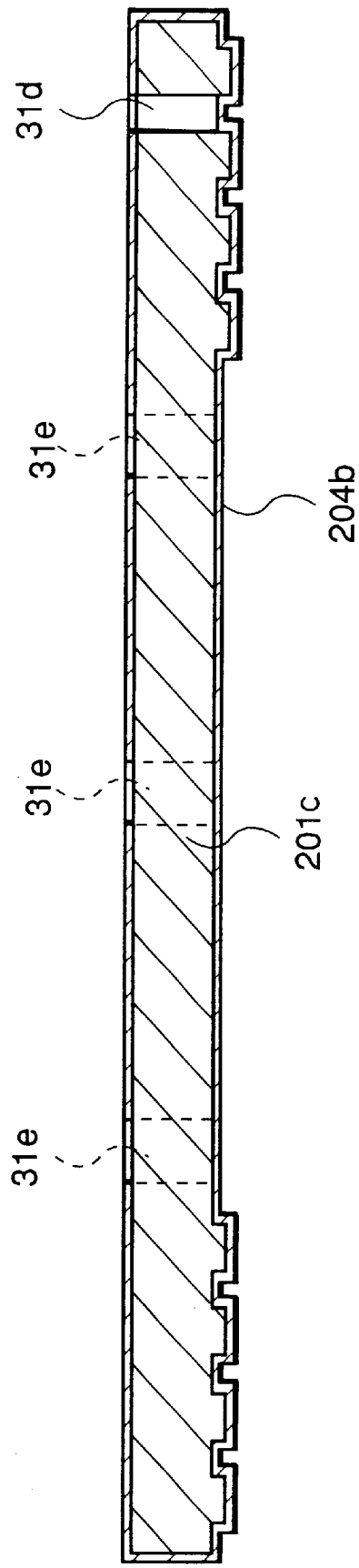
Figure 19N:
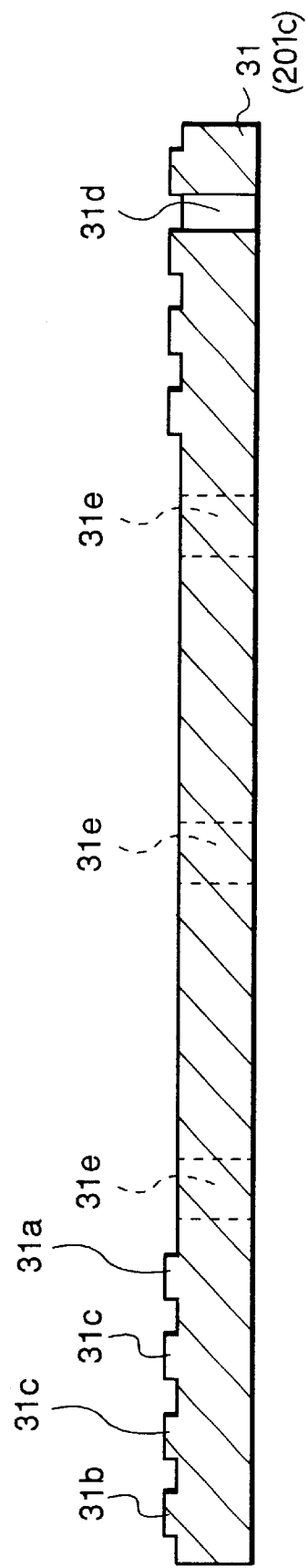

As shown in FIG. 19M, the wafer shown in FIG. 19L is etched until a suction port 31d and pin holes 31e are formed.

As this etching, wet etching using an alkali solution as an etchant is preferable. As the alkali solution, a solution of ammonia, or an organic ammonia-based solution can be used.

Finally, as shown in FIG. 19N, the patterned photoresist film 204b is removed using hydrofluoric acid, thus completing the wafer support table 31.

In the resultant wafer support table 31, the surface of the wafer 201a as the material directly serves as the sealing portions 31a and 31b and the deflection prevention portions 31c. Consequently, when the wafer support table 31 is manufactured using the wafer 201a having sufficient surface planarity, the surface need not be processed after the photoresist film 203a is removed.

As described above, the wafer support table 31 according to this embodiment can be easily manufactured at low cost. For example, when particles adhere to the wafer support table 31, and the particles can hardly be removed by cleaning, the wafer support table can be exchanged with another wafer support table 31 at low cost.

The above wafer support apparatus 3 is suitably used to support one of two wafers to be overlaid and brought into contact with each other. An apparatus and method of bringing first and second wafers into contact with each other by pressing the lower surface of the second wafer while the first wafer is supported by the wafer support apparatus 3 to oppose the second wafer will be described below. These apparatus and method are suitably used to practice the method of bonding two wafers to manufacture a wafer having, e.g., an SOI structure.

Figure 20:
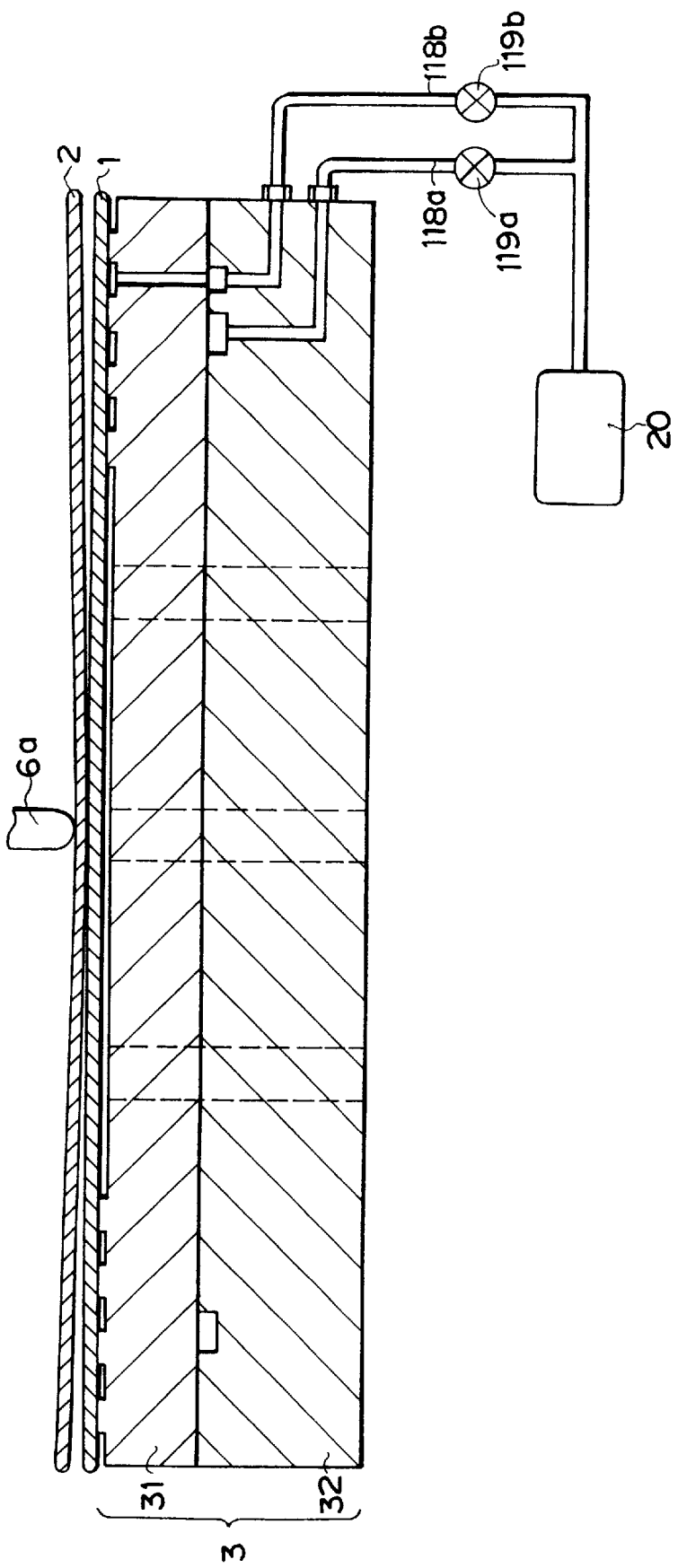
FIG. 20 is a view showing a state wherein two wafers are brought into contact using the wafer support apparatus.

FIG. 20 is a view showing a state wherein two wafers are brought into contact with each other using the wafer support apparatus 3. To bring the two wafers into contact with each other, the first wafer 1 is chucked on the wafer support table 31, and then, the second wafer 2 is set to oppose the first wafer 1. In this state, the lower surface of the second wafer 2 is pressed near its central portion by a press pin 6a. First, the wafers 1 and 2 come into contact at the central portion first. The contact portion gradually expands outward, and finally, the entire surfaces of the wafers 1 and 2 are completely in contact with each other. According to this method, the two wafers can be brought into contact with each other without leaving any gas between the two wafers 1 and 2.

When the wafer support table 3 is to be applied to bring two wafers into contact with each other, the chuck portion of the wafer support table 3, which is made up of the sealing portions 31a and 31b, is preferably brought into contact only with the peripheral portion (and more preferably, the outermost portion) of the first wafer 1. The chuck portion is preferably annular. As described above, the wafer support table 3 preferably has the deflection prevention portions 31c. The deflection prevention portions 31c are preferably formed between the sealing portions 31a and 31b. When the wafer support table 3 comes into contact only with the lower surface of the first wafer, the surface of the first wafer 1 can be prevented from being contaminated by particles. In addition, damage to the edge portion of the first wafer 1 can be prevented. Furthermore, when the wafer support table 3 comes into contact only with the peripheral portion as part of the lower surface of the first wafer, unevenness on the first wafer 1 supported on the wafer support table 3 due to particles which may adhere to the wafer support table 3 or the lower surface of the first wafer 1 can be prevented.

A wafer processing apparatus incorporating the wafer support apparatus 3 will be described next.

Figure 21:
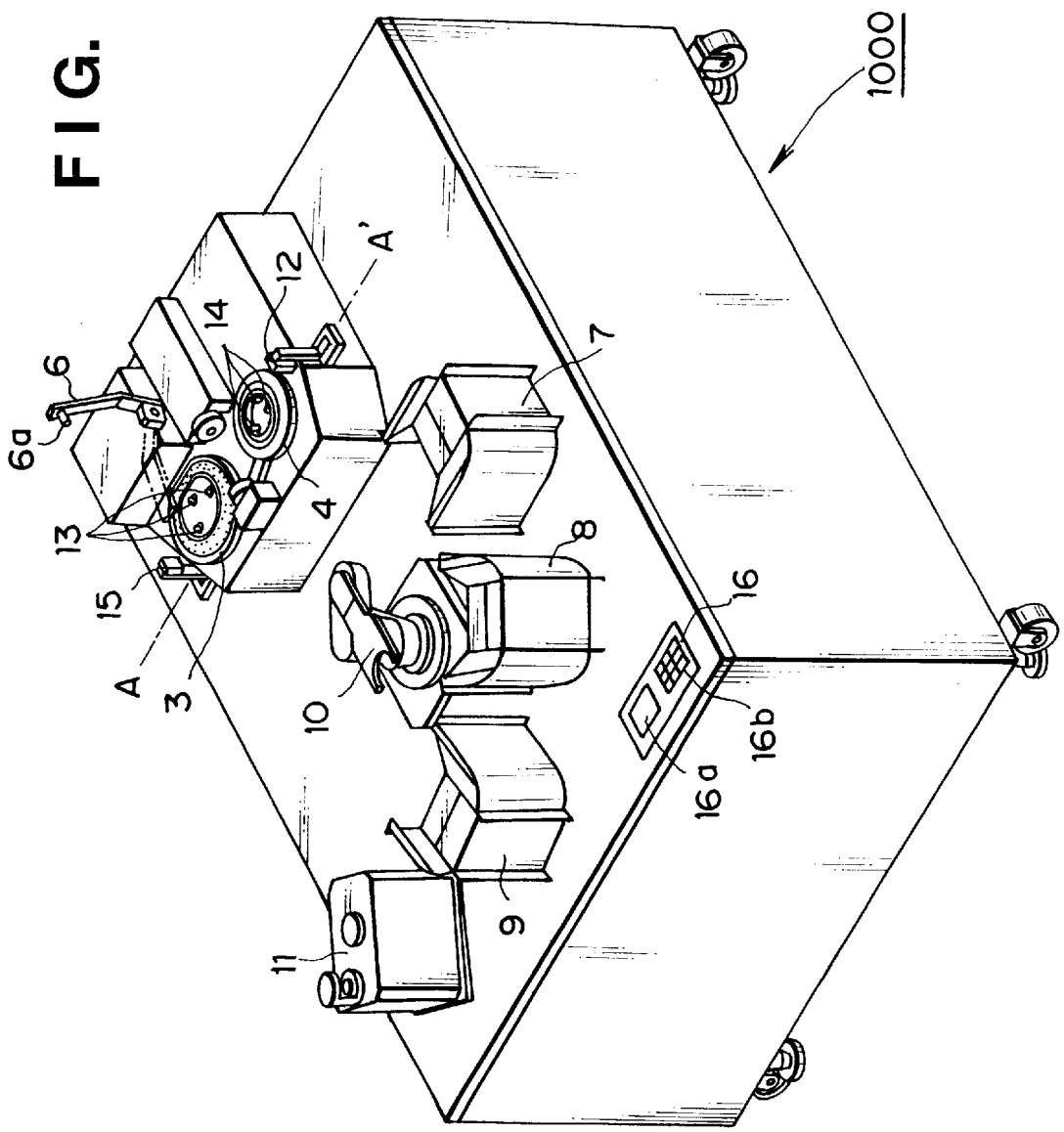
FIG. 21 is a perspective view schematically showing the overall arrangement of a wafer processing apparatus.
Figure 22:
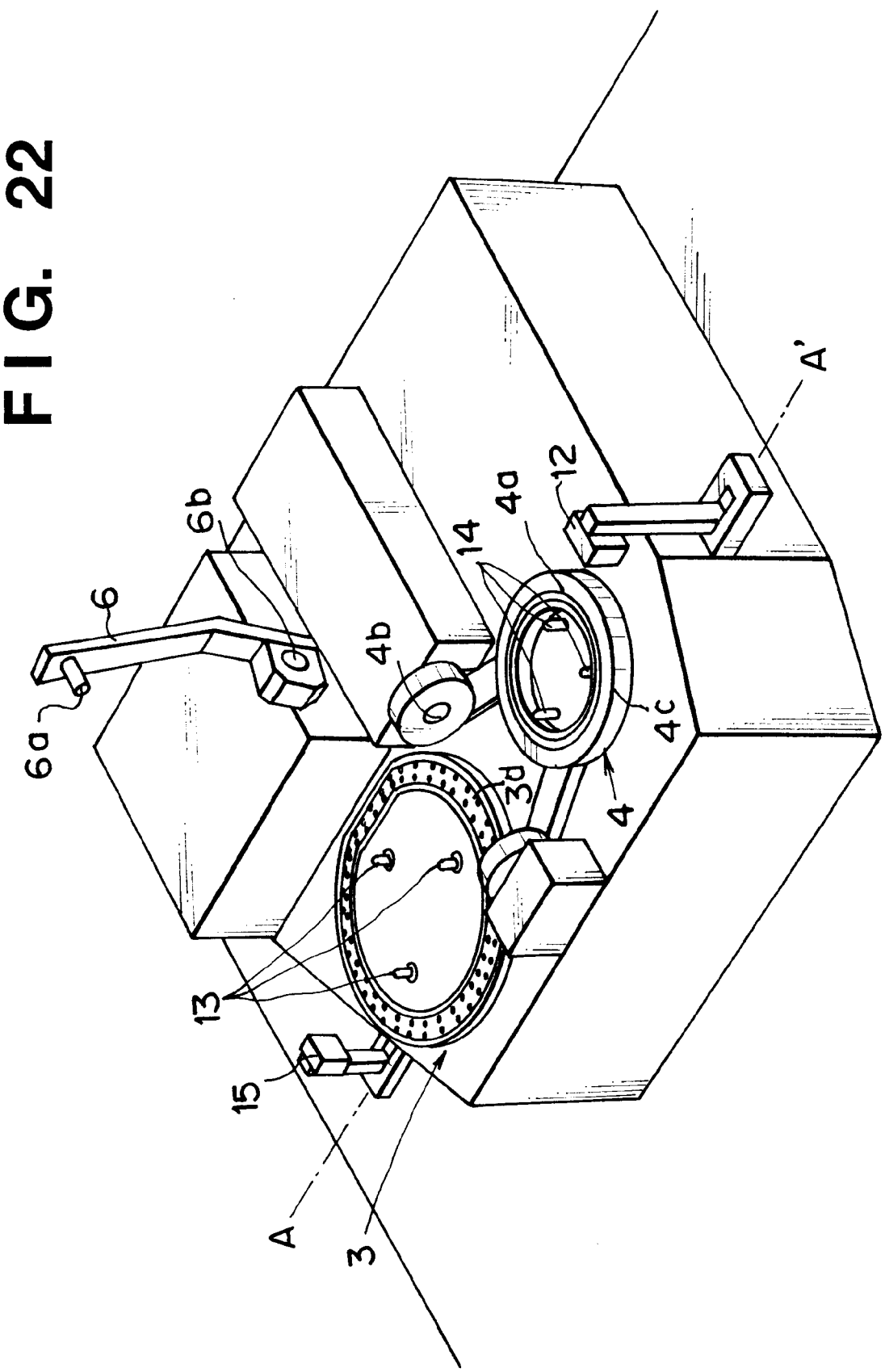
FIG. 22 is an enlarged view of part of FIG. 21.

FIG. 21 is a perspective view schematically showing the overall arrangement of the wafer processing apparatus according to the third embodiment. FIG. 22 is an enlarged view of part of FIG. 21. FIGS. 23 to 27 are sectional views of a wafer processing apparatus 1000 shown in FIGS. 21 and 22 taken along a line A–A'. FIGS. 23 to 27 show the operation of bringing two wafers into contact.

This wafer processing apparatus 1000 continuously overlays and contacts two wafers, and is conveniently used to practice the method of bonding two wafers to manufacture a wafer having, e.g., and SOI structure.

The wafer processing apparatus 1000 has the wafer support apparatus 3 for supporting the first wafer 1 (FIG. 20) from its lower surface, and a wafer moving mechanism 4 for chucking the second wafer 2 (FIG. 20) from its lower surface and making the second wafer 2 oppose almost parallel to the first wafer 1.

As described above, the wafer support apparatus 3 is built by mounting the wafer support table 31 on the base 32 and opening the valve 119a to chuck the wafer support table 31 on the base 32.

The wafer moving mechanism 4 preferably comes into contact only with the lower surface of the second wafer 2. In this embodiment, the wafer moving mechanism 4 has a groove 4a for vacuum-chucking the wafer. To chuck the second wafer 2, the pressure in the groove 4a is reduced. With the lower surface of the second wafer 2 chucked by a wafer chuck portion 4c, the wafer moving mechanism 4 pivots about a shaft 4b through about 180° to make the second wafer 2 oppose almost parallel to the first wafer 1. The shaft 4b is located near the middle position between the wafer support apparatus 3 and the wafer chuck portion 4c.

The wafer processing apparatus 1000 also has, as a mechanism for adjusting the gap between the two wafers 1 and 2 facing each other, a displacement detection section 15 for measuring the thickness of the first wafer 1 mounted on the wafer support apparatus 3, a displacement detection section 12 for measuring the thickness of the second wafer 2 chucked by the wafer chuck portion 4c, and a Z-axis stage 5 (FIG. 23) for vertically moving the wafer support apparatus 3 on the basis of the measurement results from the displacement detection sections 12 and 15 to adjust the gap between the wafers 1 and 2 to a set value.

The wafer processing apparatus 1000 also has a press mechanism 6 for pressing the upper wafer 2 near its central portion while the two wafers 1 and 2 are supported to be opposite to each other. A press pin 6a of the press mechanism 6 pivots about a shaft 6b to be close to the lower surface of the upper wafer 2 after the two wafers 1 and 2 are supported to be opposite to each other. When the wafer chuck portion 4c of the wafer moving mechanism 4 cancels chucking of the upper wafer 2, the press mechanism 6 presses the upper wafer 2 by pressing the press pin 6a against the lower surface of the wafer 2. The two wafers 1 and 2 gradually come into contact with each other outward from the pressed portion, and accordingly, the gas between the wafers 1 and 2 is expelled outward. As a consequence, no gas remains entrapped between the wafers 1 and 2.

The wafer 2 is preferably pressed by the press pin 6a almost simultaneously with cancel of chucking of the wafer 2 by the wafer chuck portion 4c. In this case, pressing can be started while maintaining the gap between the two wafers 1 and 2, which is adjusted to the set value. This ensures uniformity of the quality of the interface in the wafer obtained by bringing the two wafers into contact. In addition, gas entrapment between the wafers 1 and 2 can be more effectively prevented. Furthermore, shift of the wafers 1 and 2 can be prevented.

The press mechanism 6 incorporates a vibrator (e.g., a piezoelectric element) for vibrating the press pin 6a. By vibrating the press pin 6a which is pressing the wafer 2, the gas between the wafers 1 and 2 can be efficiently removed.

Pressing the wafer 2 by the press pin 6a may be controlled at another timing. For example, pressing may be performed at a predetermined timing before a predetermined amount of gas between the wafers 1 and 2 is removed after chucking of the wafer 2 is canceled, at a timing upon counting a predetermined time after chuck of the wafer 2 is canceled, or at a predetermined timing after chucking of the wafer 2 is canceled and before the distance between the wafers 1 and 2 becomes a predetermined distance or less due to the weight of the wafer 2.

The wafer processing apparatus 1000 also has a wafer transfer robot 10 for setting the wafers 1 and 2 on the wafer support apparatus 3 and the wafer chuck portion 4c, respectively, and receiving the wafers in contact with each other from the wafer support apparatus 3, and a wafer alignment section 11.

In this wafer processing apparatus 1000, before the start of wafer contact processing, wafer cassettes 7 and 8 storing unprocessed wafers 1 and 2, and a wafer cassette 9 for storing processed wafers are set at predetermined positions. In this embodiment, unprocessed wafers 1 and 2 are stored in the wafer cassettes 7 and 8, respectively, while facing the lower surfaces down.

When the start of wafer contact processing is instructed with an operation switch 16b on a control panel 16, the wafer transfer robot 10 chucks the lower surface of an unprocessed wafer 1 stored in the wafer cassette 7, and transfers the wafer 1 to the wafer alignment section 11. The wafer alignment section 11 detects the central position and direction (e.g., the orientation flat or notch position) of the transferred wafer 1 using a sensor and adjusts the central position and direction. The wafer alignment section 11 preferably comes contact with only the lower surface of the wafer 1.

After this, the wafer transfer robot 10 receives the aligned wafer 1 and sets it at a predetermined position on load pins 13 which project from the wafer support apparatus 3 through the pin holes 31e and 32d. After the wafer 1 is mounted on the load pins 13, the wafer support apparatus 3 moves upward, so the wafer 1 is supported by the wafer support apparatus 3. Since the wafer 1 has already been aligned by the wafer alignment section 11 and transferred to the wafer support apparatus 3 while maintaining its positional relationship, the central position and direction of the wafer 1 need not be adjusted again on the wafer support apparatus 3. However, alignment of the wafer 1 may be performed on the wafer support apparatus 3.

Next, the wafer transfer robot 10 extracts an unprocessed wafer 2 from the wafer cassette 8. With the same procedures as described above, the wafer alignment section 11 adjusts the central position and direction of the wafer 2, and then, the wafer 2 is set at a predetermined position on load pins 14 which project from the wafer chuck portion 4c of the wafer moving mechanism 4. After the wafer 2 is mounted on the load pins 14, the wafer chuck portion 4c pivots about the shaft 4b until the wafer chuck portion 4c contacts the lower surface of the wafer 2. The pressure in the groove 4a is reduced, so the wafer 2 is chucked by the wafer chuck portion 4c. As described above, since the wafer 2 has already been aligned by the wafer alignment section 11 and chucked by the wafer chuck portion 4c while maintaining its positional relationship, the central position and direction of the wafer 2 need not be adjusted again in chucking. In chucking the wafer 2, the load pins 14 may be retracted downward instead of pivoting the wafer chuck portion 4c.

While the wafers 1 and 2 are being supported by the wafer support apparatus 3 and the wafer chuck portion 4c, respectively, the displacement detection sections 15 and 12 measure the thicknesses of the wafers 1 and 2. More specifically, the displacement detection sections 15 and 12 move sensors 15a and 12a close to the upper portions of the wafers 1 and 2, irradiate the wafers 1 and 2 with light, and measure the thicknesses of the wafers 1 and 2 on the basis of the reflected light, respectively.

When measurement of the thicknesses of the wafers 1 and 2 is ended, the wafer chuck portion 4c pivots about the shaft 4b through about 180° to make the wafer 2 oppose and almost parallel to the wafer 1, as described above. After this, the gap between the wafers 1 and 2 is adjusted by the Z-axis stage 5, and the wafer 2 is pressed by the press pin 6a, thus completing contact processing.

When contact processing is ended, the wafer support apparatus 3 is moved downward by the Z-axis stage 5, and the processed wafers are supported by the load pins 13. After this, the wafer transfer robot 10 receives the processed wafers and stores them in the wafer cassette 9.

By repeatedly executing the above procedure, a plurality of wafers stored in the wafer cassettes 7 and 8 can be continuously processed.

The operation of the wafer processing apparatus 1000 in bringing two wafers into contact will be described next with reference to FIGS. 23 to 27.

Figure 23:
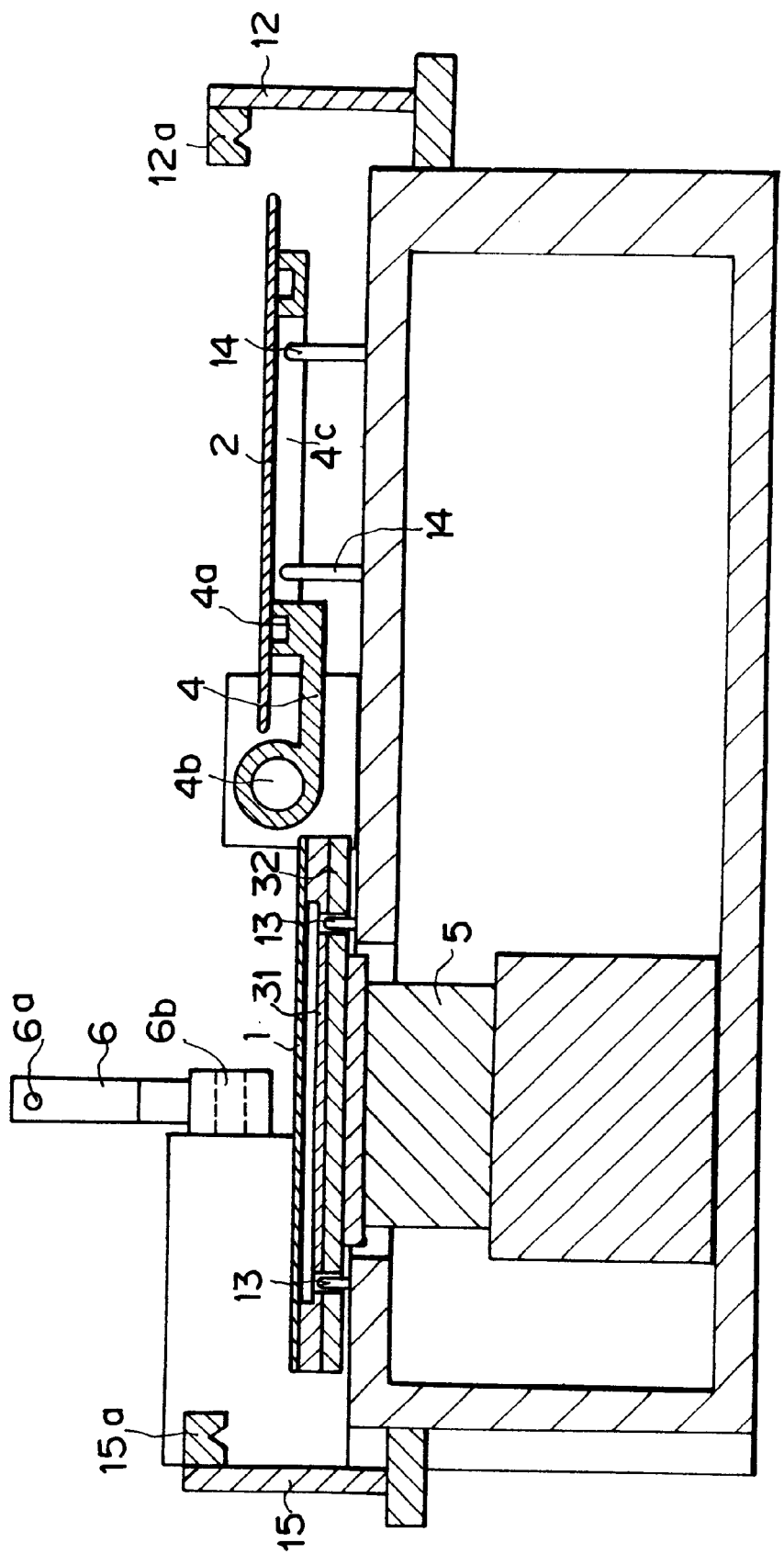
FIGS. 23 to 27 are sectional views of the wafer processing apparatus shown in FIGS. 21 and 22 taken along a line A–A'.

When the wafers 1 and 2 are mounted on the load pins 13 and 14 by the wafer transfer robot 10, respectively, the Z-axis stage 5 moves the wafer support apparatus 3 upward to a predetermined position at which the wafer 1 is supported, and the wafer moving mechanism 4 pivots the wafer chuck portion 4c about the shaft 4b to a predetermined position at which the wafer 2 can be chucked, as shown in FIG. 23.

Figure 24:
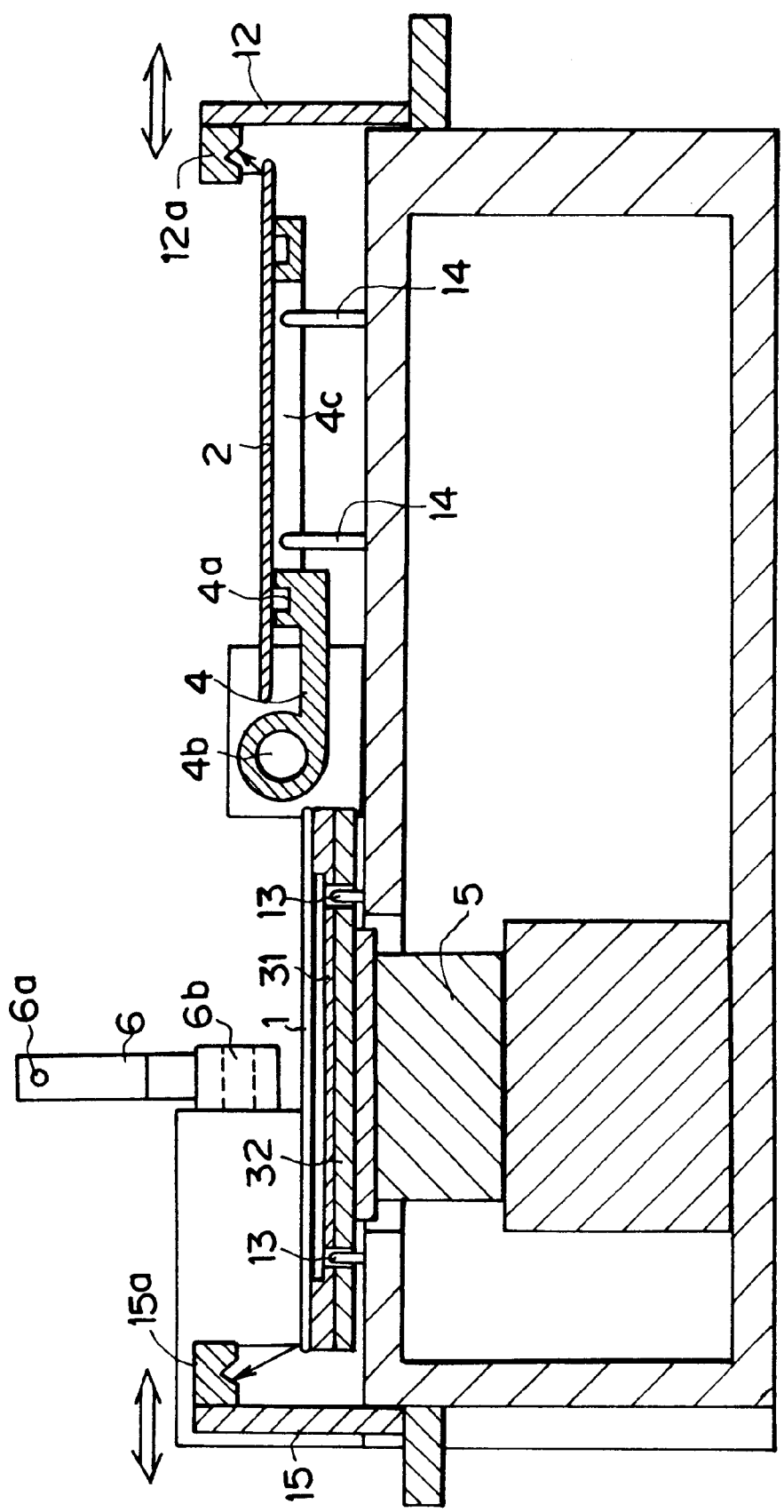

Next, as shown in FIG. 24, the sensors 15a and 12a of the displacement detection sections 15 and 12 move onto the wafers 1 and 2 to measure the thicknesses of the wafers 1 and 2, respectively. After the thicknesses of the wafers 1 and 2 are measured, the sensors 15a and 12a return to the initial positions shown in FIG. 23.

Figure 25:
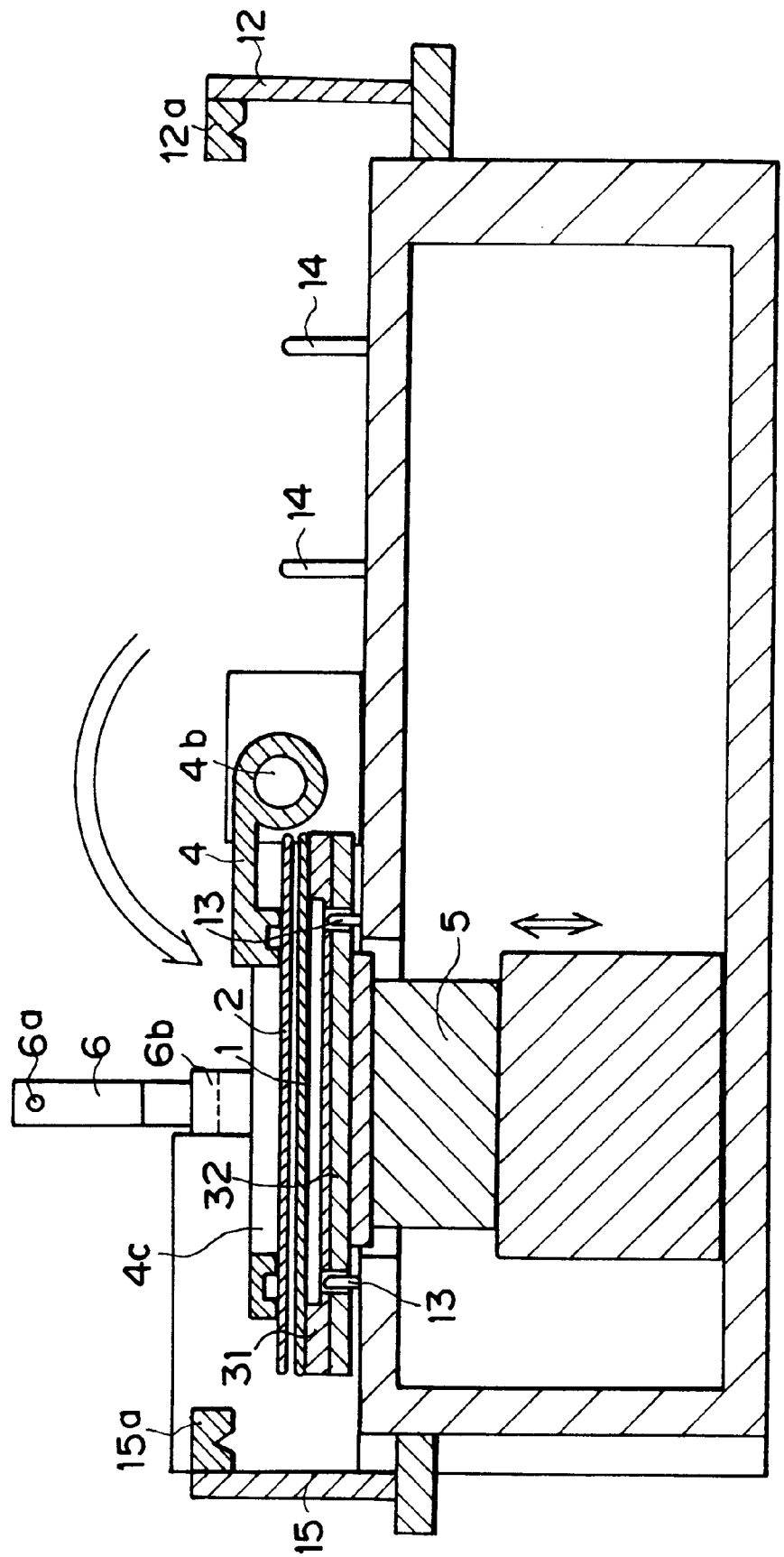

As shown in FIG. 25, the wafer moving mechanism 4 pivots the wafer chuck portion 4c about the shaft 4b through approximately 180° to make the wafers 1 and 2 opposite to each other almost in the horizontal direction. The height of the wafer support apparatus 3 is adjusted by the Z-axis stage 5 on the basis of the measured thicknesses of the wafers 1 and 2 to set the gap between the wafers 1 and 2 at a set value. The gap is preferably 20 to 100 μm at the central portion of the wafers and, more preferably, 30 to 60 μm. The wafer processing apparatus 1000 opens the valve 119b so that the peripheral portion of the lower surface of the wafer 1 is chucked by the chuck surface of the peripheral portion 3d of the wafer support apparatus 3. With this operation, the wafer 1 is corrected to be almost flat.

Figure 26:
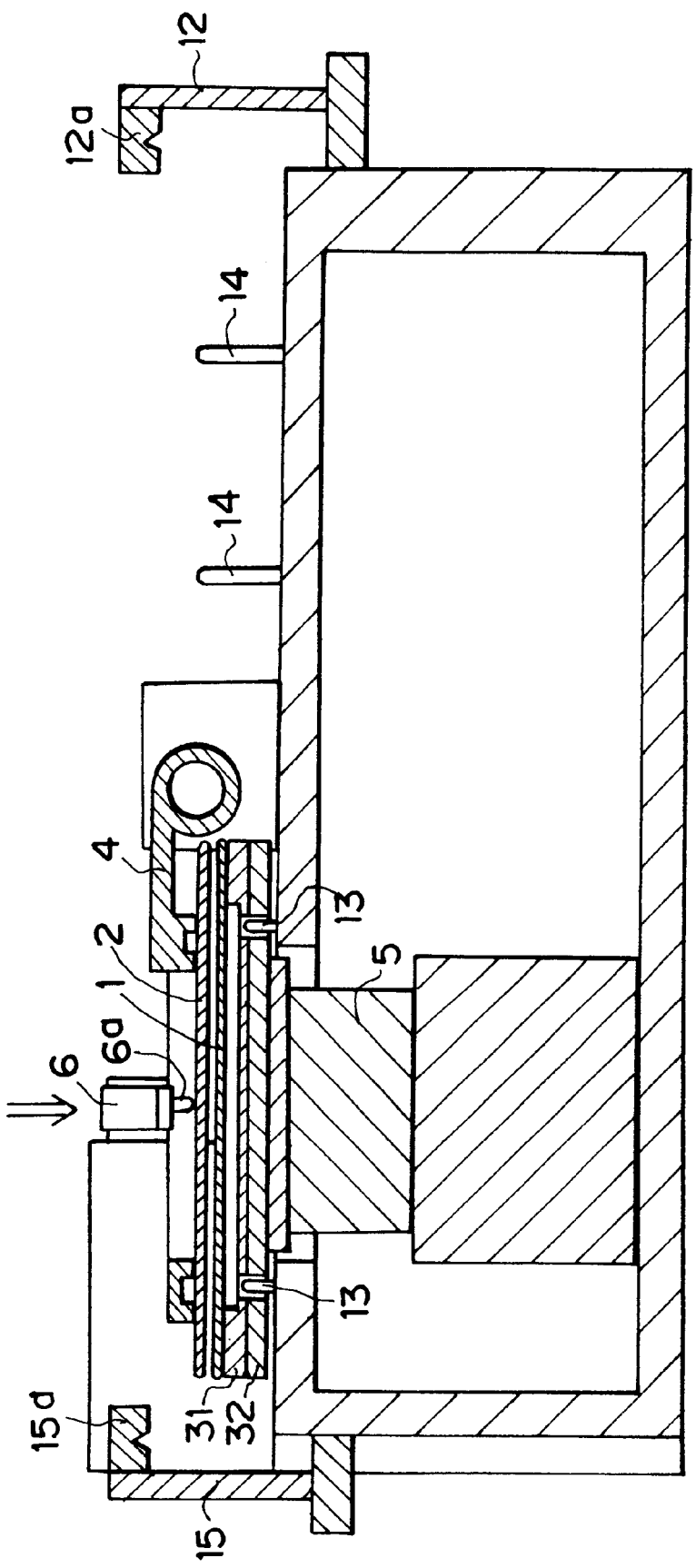

As shown in FIG. 26, the press pin 6a is pivoted about the shaft 6b to be close to the lower surface of the wafer 2 (e.g. , a position at which the press pin 6a is substantially in contact with the lower surface of the wafer 2).

Figure 27:
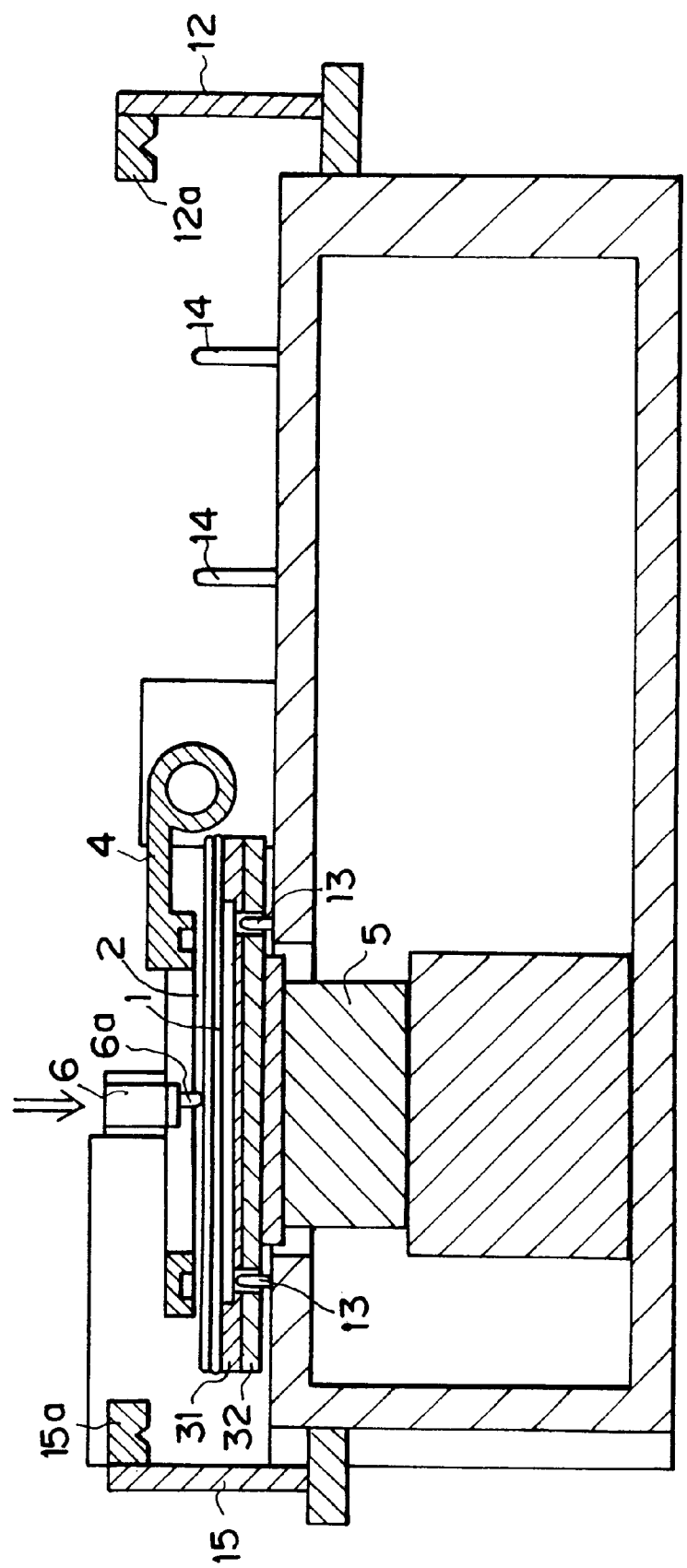

Subsequently, as shown in FIG. 27, the lower surface of the wafer 2 is pressed by the press pin 6a when chucking of the wafer 2 by the wafer chuck portion 4c is canceled. The wafers 1 and 2 gradually come into contact with each other outward from the central portion, and finally, the entire surfaces are in contact with each other.

After the press mechanism 6 is returned to the initial state (state shown in FIG. 23), the wafer chuck portion 4c is returned to the initial state (state shown in FIG. 23). The valve 119b is closed to set the interior of the chuck groove 3a to the atmospheric pressure (chucking of the wafer 1 is canceled), and then, the wafer support apparatus 3 is moved downward, so that the wafers in contact with each other are supported by the load pins 13. In this state, the wafer transfer robot 10 chucks the lower surface of the wafers in contact with each other, transfers them to the wafer cassette 9, and stores them in the wafer cassette 9.

Figure 28:
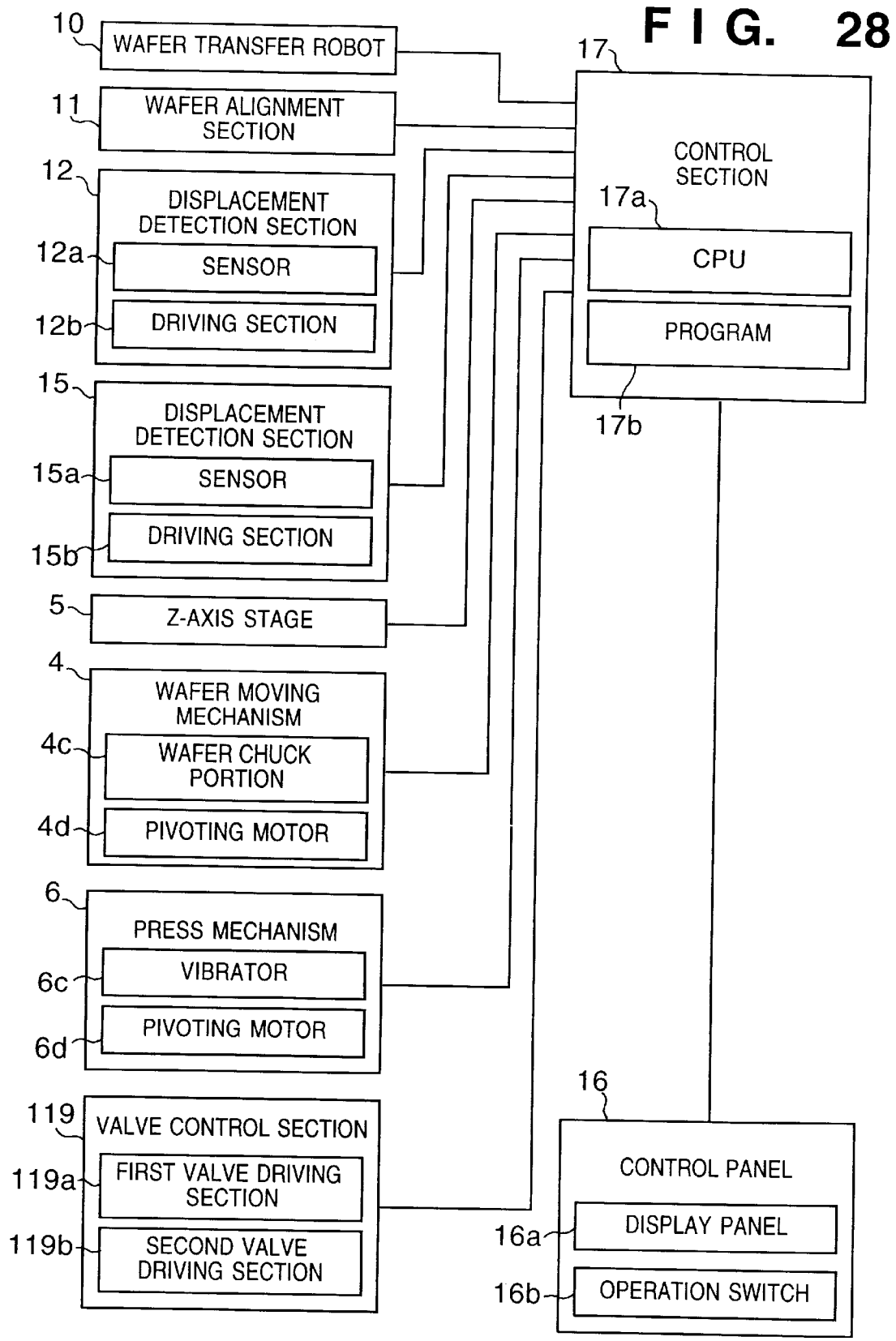
FIG. 28 is a block diagram showing the arrangement of the control system of the wafer processing apparatus.

FIG. 28 is a block diagram showing the arrangement of the control system of the wafer processing apparatus 1000. A control section 17 controls the wafer transfer robot 10, the wafer alignment section 11, the displacement detection sections 12 and 15, the Z-axis stage 5, the wafer moving mechanism 4, the press mechanism 6, the panel section 16, and a valve control section 119 by a CPU 17a which operates on the basis of a program 17b.

The valve control section 119 has a first valve driving section 119c for controlling switching of the valve 119a and a second valve driving section 119d for controlling switching of the valve 119b. The first and second valve driving sections 119c and 119d are controlled by the control section 17. Attachment/detachment of the wafer support table 31, i.e., switching of the valve 119a is controlled on the basis of the operation of the operation switch 16b of the panel 16.

Figure 29:
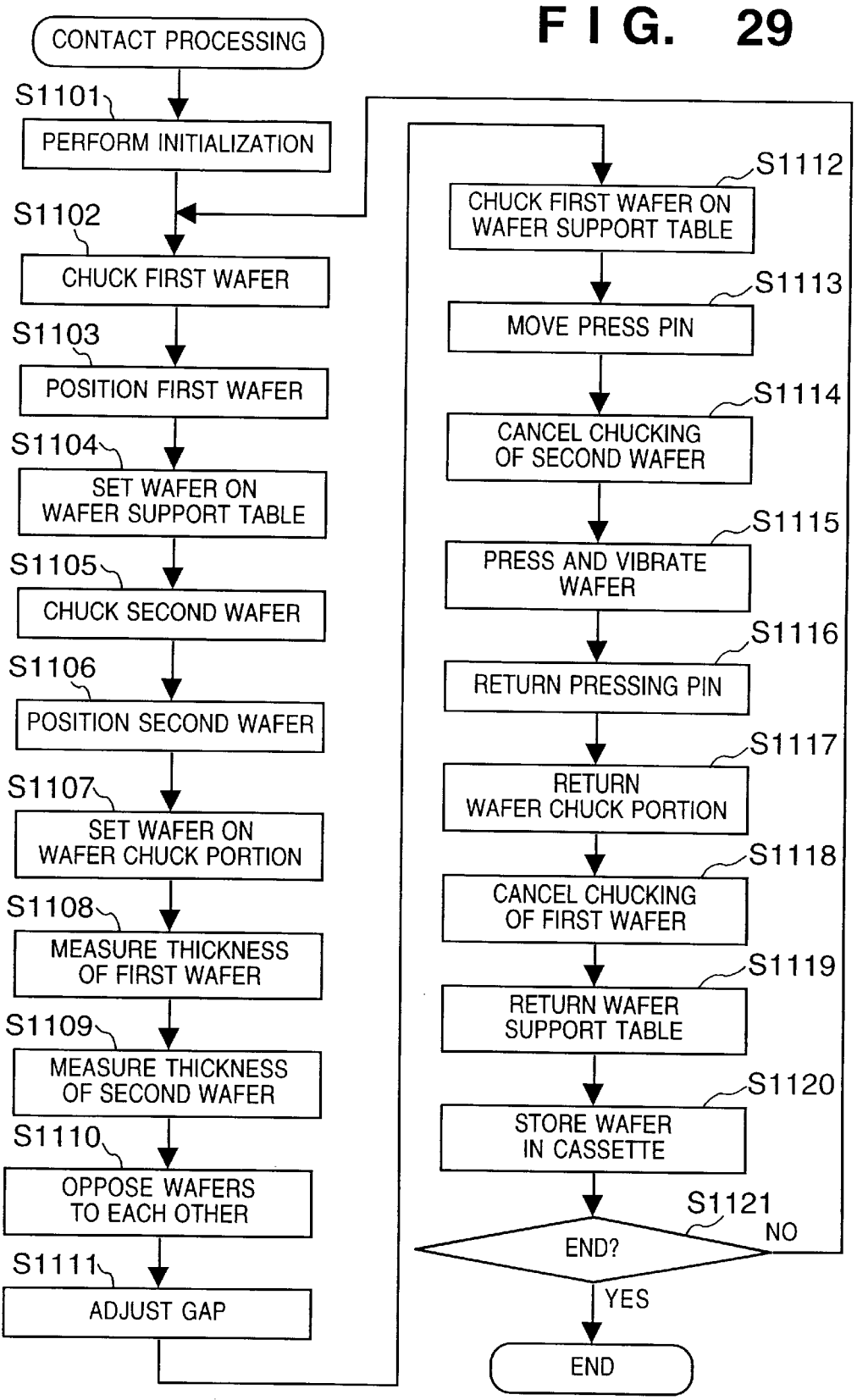
FIG. 29 is a flow chart showing the control procedure based on a program.

FIG. 29 is a flow chart showing the control procedure based on the program 17b. The operation of the control system of the wafer processing apparatus 1000 will be described with reference to the flow chart.

When the start of contact processing is instructed by operating the operation switch 16b, constituent elements connected to the control section 17 are initialized in step S1101. In this initialization step, the presence and positions of the wafer cassettes 7, 8, and 9 are also confirmed. If preparation is not complete, this is indicated on a display panel 16a to warn the operator.

In step S1102, a wafer 1 stored in the wafer cassette 7 is chucked by controlling the wafer transfer robot 10. In step S1103, the chucked wafer 1 is transferred to the wafer alignment section 11 and positioned (central position and direction). In step S1104, the wafer 1 is set at a predetermined position on the load pins 13 projecting from the wafer support apparatus 3 by controlling the wafer transfer robot 10. The wafer support apparatus 3 is moved upward to a predetermined position by controlling the Z-axis stage 5.

In step S1105, a wafer 2 stored in the wafer cassette 8 is chucked by controlling the wafer transfer robot 10. In step S1106, the wafer 2 is transferred to the wafer alignment section 11 and aligned (central position and direction). In step S1107, the wafer 2 is set at a predetermined position on the load pins 14 projecting from the wafer chuck portion 4c by controlling the wafer transfer robot 10. The wafer chuck portion 4c is pivoted about the shaft 4b through a predetermined angle by controlling a pivoting motor 4d of the wafer moving mechanism 4, so the wafer 2 is chucked by the wafer chuck portion 4c.

In step S1108, the sensor 15a is moved to a predetermined position on the wafer 1 by controlling a driving section 15b of the displacement detection section 15, so the thickness of the wafer 1 is measured by the sensor 15a.

In step S1109, the sensor 12a is moved to a predetermined position on the wafer 2 by controlling a driving section 12b of the displacement detection section 12, so the thickness of the wafer 2 is measured by the sensor 12a.

In step S1110, the wafer chuck portion 4c is pivoted about the shaft 4b through about 180° by controlling the pivoting motor 4d of the wafer moving mechanism 4 to make the wafers 1 and 2 opposite to each other almost in the horizontal direction.

In step S1111, data for adjusting the gap between the wafers 1 and 2 to a set value is prepared on the basis of the measurement result of the thicknesses of the wafers 1 and 2. The Z-axis stage 5 is controlled on the basis of the data to adjust the gap between the wafers 1 and 2.

In step S1112, the second valve driving section 119d opens the valve 119b, so the first wafer 1 is chucked by the wafer support table 31.

In step S1113, the press pin 6a is pivoted about the shaft 6b by controlling a pivoting motor 6d of the press mechanism 6 until the distal end portion of the press pin 6a roughly contacts the lower surface of the wafer 2.

In step S1114, chucking of the wafer 2 by the wafer chuck portion 4c is canceled. In step S1115, the pivoting motor 6d and a vibrator 6c of the press mechanism 6 are controlled to press the press pin 6a against the lower surface of the wafer 2 and simultaneously vibrate the press pin 6a. When step S1115 is executed immediately after step S1114, cancel of chucking of the wafer 2 and pressing can be performed almost simultaneously. Pressing may be started after step S1114, e.g., after a predetermined time is counted.

When the wafers 1 and 2 are completely in contact with each other, the pivoting motor 6d of the press mechanism 6 is controlled to return the press pin 6a to the initial position in step S1116. In step S1117, the pivoting motor 4d of the wafer moving mechanism 4 is controlled to return the wafer chuck portion 4c to the initial position.

In step S1118, the valve 119b is closed to return the interior of the chuck grooves 3a and 3b to the atmospheric pressure, thereby canceling chucking of the wafer 1. In step S1119, the Z-axis stage 5 is controlled to move the wafer support apparatus 3 downward to the initial state. With this operation, the wafers in contact with each other are supported by the load pins 13.

In step S1120, the wafer transfer robot 10 is controlled to transfer the wafers in contact with each other to the wafer cassette 9 and store them in the wafer cassette 9.

In step S1121, it is determined whether contact processing has been performed for all wafers stored in the wafer cassettes 7 and 8. If wafers which have not been processed yet remain, the flow returns to step S1102 to repeat the processing. If it is determined that contact processing has been performed for all wafers, the series of processing operations are ended. At this time, the operator is preferably notified of the end of processing by an indication on the display panel 16a or a buzzer sound.

As described above, according to the wafer processing apparatus 1000, 1) since pressing is started in synchronism with cancel of chucking of the upper wafer 2, the gas between the wafers 1 and 2 can be properly removed outward, 2) since the upper wafer 2 does not slide when the wafers 1 and 2 oppose each other, the two wafers land 2 can be properly positioned, 3) since the gap between the wafers 1 and 2 can be adjusted to an appropriate distance, the quality of the manufactured wafer can be uniformed, and the wafers 1 and 2 need not be classified in advance, 4) the surfaces of the wafers 1 and 2 can be prevented from being contaminated by particles, 5) damage to the peripheral portions of the wafers can be prevented, and 6) gas entrapment between the wafers can be decreased by vibrating the wafers during pressing.

In addition, according to the wafer processing apparatus 1000, only the sealing portions 31a and 31b and the deflection prevention portions 31c of the wafer support table 31 come into contact with the lower surface of the first wafer 1. For this reason, even when particles adhere to the central portion of the wafer support apparatus 3 or the central portion of the lower surface of the first wafer 1, the first wafer can be supported in an almost flat state. In other words, unevenness on the supported wafer 1 due to particles which may adhere to the central portion of the wafer support table or the first wafer can be prevented. Therefore, when the two wafers are brought into contact with each other, gas entrapment between the wafers can be effectively prevented.

Furthermore, since the wafer processing apparatus 1000 employs the wafer support table 31 manufactured by fabricating a wafer, the problem of contamination (e.g., metal contamination) by the material of the wafer support table is also solved.

[Application Example of Wafer Processing Apparatus]

An application example of the wafer processing apparatus according to the third embodiment will be described below. FIGS. 13A to 13F are views showing steps in manufacturing a wafer having, e.g., an SOI structure.

A single-crystalline Si wafer 501 for forming the first wafer 1 is prepared. A porous Si layer 502 is formed on a major surface of the single-crystalline Si wafer 501 (FIG. 13A). At least one non-porous layer 503 is formed on the porous Si layer 502 (FIG. 13B). As the non-porous layer 503, a single-crystalline Si layer, a polycrystalline Si layer, an amorphous Si layer, a metal layer, a semiconductor compound layer, or a superconductor layer is suitable. A device such as a MOSFET may be formed on the non-porous layer 503.

An $SiO_2$ layer 504 is formed on the non-porous layer 503 to obtain a first wafer 1 (FIG. 13C). The first wafer 1 with the $SiO_2$ layer 504 facing up is stored in the wafer cassette 7.

The second wafer 2 is prepared. The second wafer 2 with its surface facing up is stored in the wafer cassette 8.

The wafer shown in FIG. 13C may be stored in the wafer cassette 8 as the second wafer while another wafer may be stored in the wafer cassette 7 as the first wafer. In this case, the wafer shown in FIG. 13C is transferred to the wafer support table 31, and another wafer is transferred to the wafer moving mechanism 4.

In this state, the wafer processing apparatus of the third embodiment is operated. The first wafer 1 and the second wafer 2 come into contact with each other while sandwiching the $SiO_2$ layer 504 (FIG. 13D), and stored in the wafer cassette 9.

The wafers in contact with each other (FIG. 13D) may be subjected to anode bonding, pressing, or heat treatment, as needed, or these processing operations may be combined to firmly bond the wafers.

As the second wafer 2, an Si wafer, an Si wafer with an $SiO_2$ layer formed thereon, a transparent wafer consisting of silica glass, or a sapphire wafer is suitably used. However, any other wafer can be used as the second wafer 2 as far as it has a sufficiently flat surface to be bonded.

Next, the first wafer 1 is removed from the second wafer 2 to expose the porous Si layer 502 (FIG. 13E). The porous Si layer 502 is selectively etched and removed. FIG. 13F schematically shows the wafer obtained by the above manufacturing method.

According to this manufacturing method, the two wafers are brought into contact with each other while appropriately removing any gas between the wafers, so a high-quality wafer can be manufactured.

According to the present invention, a substrate support table which can be manufactured at low cost can be provided.

The present invention is not limited to the above embodiments and various changes and modifications can be made within the spirit and scope of the present invention. Therefore, to apprise the public of the scope of the present invention, the following claims are made.

What is claimed is:

1. A substrate processing apparatus for overlaying two substrates and bringing the substrates into contact with each other comprising:

support means for supporting the first substrate;

substrate manipulation means for chucking and pivoting the second substrate to oppose in a substantially parallel fashion the first substrate supported by said support means, said substrate manipulation means having at least one aperture formed therein and a chuck portion around said aperture;

pressing means operable through said aperture for pressing the second substrate against the first substrate;

wherein said support means has a support member contacting a peripheral portion of one surface of the first substrate to support the first substrate.

2. The apparatus according to claim 1, wherein said support means has chuck means for chucking the first substrate on said support member.

3. The apparatus according to claim 2, Wherein said chuck means comprises an annular groove on a surface of said support member, and the first substrate is chucked by said support member by reducing pressure in the groove.

4. The apparatus according to claim 1, wherein said support member has an annular shape.

5. The apparatus according to claim 1, wherein said support member supports an outermost portion of one surface of the first substrate.

6. The apparatus according to claim 1, wherein said pressing means presses the second substrate substantially at a central portion thereof.

7. The apparatus according to claim 1, wherein said support means further comprises, interior to said support member, a deflection prevention member for preventing deflection of the first substrate.

8. The apparatus according to claim 7, wherein said deflection prevention member supports the first substrate substantially at a central portion thereof, thereby preventing deflection of the first substrate.

9. The apparatus according to claim 7, wherein a portion where said support member is in contact with the first substrate and a portion where said deflection prevention member is in contact with the first substrate are positioned substantially in the same plane.

10. The apparatus according to claim 1, wherein the substrate manipulation means cancels support of the second substrate after the second substrate is supported to oppose the first substrate supported by said support means, and said pressing means presses the second substrate in synchronism with cancellation of support of the second substrate by said substrate manipulation means.

11. The apparatus according to claim 10, wherein said support means substantially horizontally supports the first substrate, and said substrate manipulation means substantially horizontally supports the second substrate above the first substrate and then cancels support of the second substrate.

12. A substrate support apparatus suitable for supporting either an upper or lower of two substrates to be overlaid and brought into contact with each other comprising:

a support member having an annular groove which contacts only a peripheral portion of one surface of a substrate and chucks the substrate, said support member being formed by processing a silicon member.

13. The apparatus according to claim 12 further comprising chuck means for chucking the substrate on said support member.

14. The apparatus according to claim 13, wherein said chuck means comprises an annular groove on a surface of said support member, and the substrate is chucked by said support member by reducing pressure in the groove.

15. The apparatus according to claim 12, wherein said support member has an annular shape.

16. The apparatus according to claim 12 further comprising, interior to said support member, a deflection prevention member for preventing deflection of the substrate.

17. The apparatus according to claim 16, wherein said deflection prevention member supports the substrate substantially at a central portion thereof, thereby preventing deflection of the substrate.

18. The apparatus according to claim 16, wherein a portion where said support member is in contact with the substrate and a portion where said deflection prevention member is in contact with the substrate are positioned substantially in the same plane.

19. A substrate processing method of overlaying two substrates and bringing the substrates into contact with each other comprising:

supporting a first substrate by a support member contacting a peripheral portion of one surface of the first substrate chucking, and pivoting a second substrate by substrate manipulation means, having at least one aperture formed therein and a chuck portion around said aperture, to oppose in a substantially parallel fashion the first substrate supported by said support member, and pressing through said aperture in said substrate manipulation means the second substrate toward the first substrate thereby bringing the first and second substrates into contact with each other.

20. The method according to claim 19, wherein a support member having a chuck mechanism is used as the support member.

21. The method according to claim 19, wherein an annular support member is used as the support member.

22. The method according to claim 19, wherein the support member supports an outermost portion of the first substrate.

23. The method according to claim 19, wherein the second substrate is pressed substantially at a central portion thereof.

24. The method according to claim 19, wherein the step of pressing the second substrate comprises bringing a deflection prevention member formed inside the support member into contact with the first substrate.

25. A substrate processing method of overlaying two substrates and bringing the substrates into contact with each other comprising the steps of:

transferring first and second substrates to the substrate processing apparatus of claim 1, overlaying the first and second substrates and bringing the substrates into contact with each other by the substrate processing apparatus; and receiving the substrates in contact with each other from the substrate processing apparatus.

26. A substrate processing method of overlaying two substrates and bringing the substrates into contact with each other comprising the steps of:

causing the substrate support apparatus of claim 12 to support a first substrate;

opposing a second substrate to the first substrate supported by the substrate support apparatus; and overlaying the first substrate and the second substrate and bringing the substrates into contact with each other.

27. A method of manufacturing a substrate comprising the steps of:

preparing first and second substrates; and bringing the first and second substrates into contact with each other by the substrate processing method of claim 19.

28. A method of manufacturing a substrate support table comprising the steps of:

forming an $SiO_2$ film to cover an entire silicon wafer;

forming a first photoresist film on one surface of the $SiO_2$ film;

patterning the first photoresist film to expose the $SiO_2$ film at a portion where sealing portions for vacuum chucking are to be formed;

etching the $SiO_2$ film at the exposed portion to expose the silicon wafer;

removing the remaining first photoresist film;

etching the silicon wafer at the exposed portion to a predetermined depth;

forming an $SiO_2$ film to cover the entire silicon wafer;

forming a second photoresist film on the other surface of the $SiO_2$ film;

patterning the second photoresist film to expose the $SiO_2$ film at a portion where a suction hole for vacuum chucking is to be formed;

etching the $SiO_2$ film at the exposed portion to expose the silicon wafer;

removing the remaining second photoresist film;

etching the silicon wafer at the exposed portion to form the suction hole extending through the silicon wafer; and removing the remaining $SiO_2$ film.

29. A method of manufacturing a substrate support table comprising the steps of:

forming a first film to cover an entire silicon wafer;

forming a first photoresist film on one surface of the first film;

patterning the first photoresist film to expose the first film at a portion where sealing portions for vacuum chucking are to be formed;

etching the first film at the exposed portion to expose the silicon wafer;

removing the remaining first photoresist film;

etching the silicon wafer at the exposed portion to a predetermined depth;

forming a second film to cover the entire silicon wafer;

forming a second photoresist film on the other surface of the second film;

patterning the second photoresist film to expose the second film at a portion where a suction hole for vacuum chucking is to be formed;

etching the second film at the exposed portion to expose the silicon wafer;

removing the remaining second photoresist film;

etching the suction wafer at the exposed portion to form the suction hole extending through the silicon wafer; and removing the remaining second film.

30. A substrate processing apparatus for overlaying two substrates and bringing the substrates into contact with each other comprising:

support means for supporting the first substrate;

substrate manipulation means for chucking and pivoting the second substrate to oppose in a substantially parallel fashion the first substrate supported by said support means, said substrate manipulation means having an annular chuck portion; and pressing means for pressing a back surface of the second substrate against the first substrate, a front surface of the second substrate opposing a front surface of the first substrate supported by said support means, wherein said support means includes:

a support member having an annular peripheral portion in contact with a back surface of the first substrate, and an interior portion, interior to said annular peripheral portion, that does not contact with the back surface of the first substrate; and chuck means for chucking the first substrate at said annular peripheral portion, and wherein said pressing means presses the back surface of the second surface at a portion within said interior portion of said support member to bring the front surfaces of the first and second substrates into contact with each other.

31. The apparatus according to claim 30, wherein said chuck means includes an annular groove on said support member, and the first substrate is chucked by said support member by reducing pressure in said groove.

32. The apparatus according to claim 30, wherein said support means further includes a deflection prevention member for preventing deflection of the first substrate, said deflection prevention member being provided on said interior portion of said support member.

33. The apparatus according to claim 32, wherein said deflection prevention member supports the first substrate substantially at a central portion thereof to prevent deflection of the first substrate.

34. The apparatus according to claim 32, wherein a portion where said support member is in contact with the first substrate and a portion where said deflection prevention member is in contact with the first substrate are substantially in the same plane.

35. The apparatus according to claim 30 further comprising substrate manipulation means, having an annular support member for chucking and pivoting the second substrate to oppose in a substantially parallel fashion the first substrate supported by said support means, said substrate manipulation means having an annular chuck portion, wherein said pressing means presses the back surface of the second substrate at a portion interior to said annular support member of said substrate manipulation means in synchronism with the canceling of chucking of the second substrate by said annular support member.

36. The apparatus according to claim 35, wherein said support means substantially horizontally supports the first substrate, and said substrate manipulation means substantially horizontally supports the second substrate above the first substrate and then cancels chucking of the second substrate.

37. A substrate support table for supporting a substrate, the table comprising:

an annular peripheral portion for contacting with a back surface of the substrate and having a groove thereon for chucking the substrate; and an interior portion, interior to said annular portion, that does not contact with the back surface of the substrate;

wherein said annular peripheral portion and said interior portion are formed by processing a silicon wafer.

38. The table according to claim 37 further comprising a deflection prevention portion for preventing the chucked substrate from deflecting.

39. The table according to claim 38, wherein in chucking the substrate, only said annular peripheral portion, said interior portion and said deflection prevention portion are brought into contact with the substrate.

40. The table according to claim 33, wherein the surfaces of said annular peripheral portion, said interior portion and said deflection prevention portion, which are in contact with the substrate to be supported, are positioned substantially in the same plane.

41. The table according to claim 37, wherein a pin hole through which a load pin for vertically moving the substrate to be supported on said substrate support table is inserted extends through said interior portion.

42. A substrate processing method of overlaying two substrates and bringing the substrates into contact with each other comprising the steps of:

preparing the substrate support table of claim 37;

supporting a first substrate by the substrate support table;

opposing a second substrate to the first substrate supported by the substrate support table so that a front surface of the second substrate opposes to a front surface of the first substrate;

pressing a back surface of the second substrate at a portion within the interior portion of the substrate support table to bring the front surfaces of the first and second substrates into contact with each other.

43. A cleaning method comprising:

cleaning the substrate support table while accommodating the substrate support table of claim 37 in a wafer cassette for storing a wafer for manufacturing a semiconductor device.

44. A method for manufacturing a bonded substrate comprising of:

preparing the substrate support table of claim 37;

supporting a first substrate by the substrate support table;

opposing a second substrate to the first substrate supported by the substrate support table so that a front surface of the second substrate opposes to a front surface of the first substrate;

pressing a back surface of the second substrate at a portion within the interior portion of the substrate support table to bring the front surfaces of the first and second substrates into contact with each other to manufacture a bonded substrate.

45. The method according to claim 44, wherein the first and second substrates are selected so that a bonded substrate having a SOI structure is manufactured.

46. A method of manufacturing an SOI substrate comprising the steps of:

preparing first and second substrates;

bringing the first and second substrates into contact with each other by the substrate processing method of claim 35 to prepare a substrate having a layer in which a single-crystalline Si layer and an insulating layer are stacked; and separating the substrates which are in contact with each other at a portion other than a contact interface to prepare one of the separated substrates as the substrate having the single-crystalline Si layer on the insulating layer.

47. A method of manufacturing an SOI substrate comprising the steps of:

preparing first and second substrates;

bringing the first and second substrates into contact with each other by the substrate processing method of claim 42 to prepare a substrate having a layer in which a single-crystalline Si layer and an insulating layer are stacked; and separating the substrates which are in contact with each other at a portion other than a contact interface to prepare one of the separated substrates as the substrate having the single-crystalline Si layer on the insulating layer.

48. A substrate processing method of overlaying two substrates and bringing the substrates into contact with each other comprising the steps of:

preparing the substrate processing apparatus of claim 30:

supporting a first substrate by the support means;

chucking and pivoting the second substrate by the substrate manipulation means to oppose in a substantially parallel fashion the first substrate supported by said support means, said substrate manipulation means having all annular chuck portion so that a front surface of the second substrate opposes to a front surface of the first substrate;

pressing a back surface of the second substrate at a portion within the interior portion of the support member by the pressing means to bring the front surfaces of the first and second substrates into contact with each other.

49. A method of manufacturing a bonded substrate comprising the steps of:

preparing the substrate processing apparatus of claim 30;

supporting a first substrate by the support means;

chucking and pivoting the second substrate by the substrate manipulation means to oppose in a substantially parallel fashion the first substrate supported by said support means, said substrate manipulation means having an annular chuck portion so that a front surface of the second substrate opposes to a front surface of the first substrate; and pressing a back surface of the second substrate at a portion within the interior portion of the support member by the pressing means to bring the front surfaces of the first and second substrates into contact with each other to manufacture a bonded substrate.

50. The method according to claim 49, wherein the first and second substrates are selected so that a bonded substrate having a SOI structure is manufactured.

* * * * *

UNITED STATES PATENT AND TRADEMARK OFFICE
CERTIFICATE OF CORRECTION

PATENT NO. : 6,383,890 B2
DATED : May 7, 2002
INVENTOR(S) : Takisawa et al.

It is certified that error appears in the above-identified patent and that said Letters Patent is hereby corrected as shown below:

Column 8,
Line 56, "detection section for" should read -- detection section 12 for --

Column 12,
Line 46, "wafer. chuck" should read -- wafer chuck --

Column 13,
Line 21, "can be more uniform" should read -- can be uniformed, --

Column 22,
Line 52, "wafers 1and 2" should read -- wafers 1 and 2 --

Column 24,
Line 23, "Wherein" should read -- wherein --

Column 25,
Line 27, "substrate chucking," should read -- substrate, chucking --

Column 26,
Line 61, "suction wafer" should read -- silicone wafer --

Column 28,
Line 4, "claim 38," should read -- claim 37, --
Line 8, "claim 33," should read -- claim 37 --
Lines 36-37, "comprising of:" should read -- comprising the steps of: --

UNITED STATES PATENT AND TRADEMARK OFFICE
CERTIFICATE OF CORRECTION

PATENT NO. : 6,383,890 B2
DATED : May 7, 2002
INVENTOR(S) : Takisawa et al.

It is certified that error appears in the above-identified patent and that said Letters Patent is hereby corrected as shown below:

Column 29,
Line 22, "all annular" should read -- an annular --

Signed and Sealed this

Fifteenth Day of October, 2002

Attest:

JAMES E. ROGAN
Attesting Officer
Director of the United States Patent and Trademark Office